(12) United States Patent
Tsai et al.

(10) Patent No.: US 10,056,316 B2
(45) Date of Patent: Aug. 21, 2018

(54) MANUFACUTING METHOD OF SEMICONDUCTOR STRUCTURE

(71) Applicant: TAIWAN SEMICONDUCTOR MANUFACTURING COMPANY LTD., Hsinchu (TW)

(72) Inventors: Tsung-Han Tsai, Miaoli County (TW); Volume Chien, Tainan (TW); Yung-Lung Hsu, Tainan (TW); Chung-Bin Tseng, Tainan (TW); Keng-Ying Liao, Tainan (TW); Po-Zen Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/823,297

(22) Filed: Nov. 27, 2017

(65) Prior Publication Data
US 2018/0082928 A1 Mar. 22, 2018

Related U.S. Application Data

(62) Division of application No. 14/331,046, filed on Jul. 14, 2014, now Pat. No. 9,831,154.

(51) Int. Cl.
| | |
|---|---|
| *H01L 21/44* | (2006.01) |
| *H01L 23/48* | (2006.01) |
| *H01L 21/768* | (2006.01) |
| *H01L 27/06* | (2006.01) |
| *H01L 27/146* | (2006.01) |

(52) U.S. Cl.
CPC ...... *H01L 23/481* (2013.01); *H01L 21/76831* (2013.01); *H01L 21/76898* (2013.01); *H01L 21/76805* (2013.01); *H01L 21/76832* (2013.01); *H01L 27/0688* (2013.01); *H01L 27/14634* (2013.01); *H01L 2224/24147* (2013.01); *H01L 2224/8203* (2013.01); *H01L 2924/0002* (2013.01)

(58) Field of Classification Search
CPC ............. H01L 21/76898; H01L 23/481; H01L 27/0688
USPC ...................................... 438/667
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |

(Continued)

*Primary Examiner* — David S Blum
(74) *Attorney, Agent, or Firm* — WPAT, P.C., Intellectual Property Attorneys; Anthony King

(57) ABSTRACT

The present disclosure provides a semiconductor structure. The structure includes a first substrate; a first dielectric layer having a first surface in proximity to the first substrate and a second surface away from the first substrate; a first interconnect penetrating the first surface of the first dielectric layer; and a protection layer extending along a portion of a sidewall of the first interconnect. A thickness of the protection layer is in a range of from about 0.02 μm to about 0.2 μm.

20 Claims, 25 Drawing Sheets

(56) References Cited

U.S. PATENT DOCUMENTS

| | | | |
|---|---|---|---|
| 9,496,189 B2 | 11/2016 | Yu et al. | |
| 2013/0105996 A1* | 5/2013 | Brink | H01L 21/76802 |
| | | | 257/786 |
| 2013/0270713 A1* | 10/2013 | Liao | H01L 21/76898 |
| | | | 257/774 |

* cited by examiner

MANUFACUTING METHOD OF SEMICONDUCTOR STRUCTURE

CROSS REFERENCE TO RELATED APPLICATIONS

This application claims the benefit of prior-titled application Ser. No. 14/331,046, now U.S. Pat. No. 9,831,154, filed Jul. 14, 2014, under 35 U.S.C. 120.

BACKGROUND

System on chip (SoC) is an integrated circuit (IC) that integrates all components of a computer or other electronic system into a single chip. In the formation of a stacked SoC wafer, devices and logic circuits can be formed on separate silicon substrates or different wafers, followed by the formation of an interconnect structure on one side of a silicon chip. SoC wafer can be bonded to a read-out chip through metal-to-metal bonding or a hybrid bonding, and the read-out chip is further bonded to peripheral circuit chip, which may be an Application Specific Integrated Circuit (ASIC) chip. Peripheral circuit chip may include Image Signal Processing (ISP) circuits, and may, or may not, further include other circuits that are related to the SoC applications. The bonding of chips may be at wafer level. In the wafer-level bonding, individual wafers are bonded together, and are then sawed into dies. Alternatively, the bonding may be performed at the chip level.

The formation of the interconnect structure in the stacked SoC wafer is used to electrically connect the electrical components in different level of wafers stacked together, and the depth of the interconnect structure is substantially greater than those not in a stacked wafer system. Interconnect structure includes dielectric layers, metal lines and metal vias. Interconnect structure may include a plurality of metal layers. Dielectric layers may include low-k dielectric layers and possibly a passivation layer(s) over the low-k dielectric layers. The low-k dielectric layers have low k values, for example, lower than about 3.0. The passivation layer may be formed of a non-low-k dielectric material having a k value greater than 3.9.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
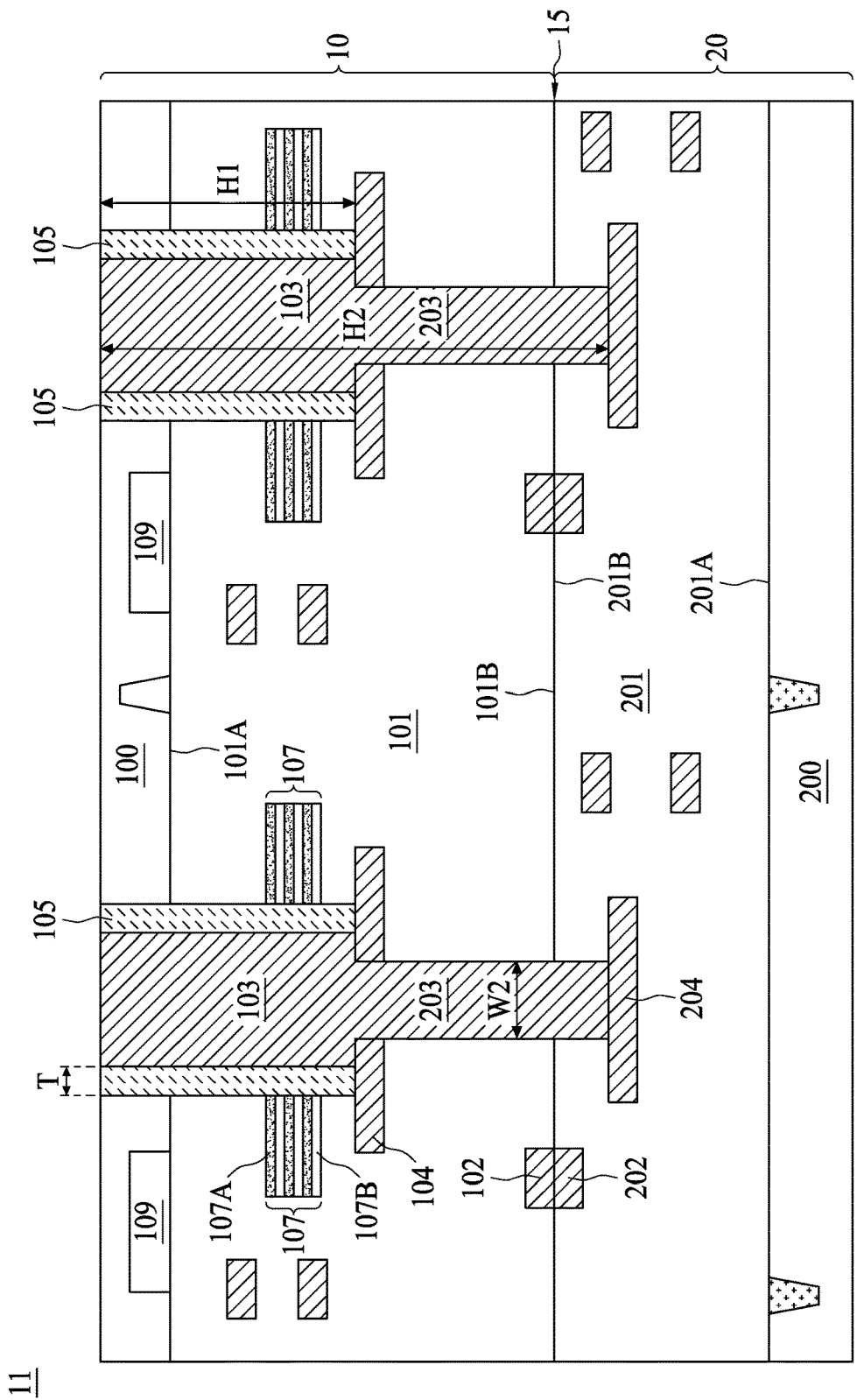
FIG. 1 is a cross section of a stacked semiconductor wafer or a stacked semiconductor chip, in accordance to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked chip/wafer and the method of forming the same are provided in accordance with various exemplary embodiments. The intermediate stages of forming the stacked chip and the respective stacked wafers are illustrated. The variations of the embodiments are discussed. Throughout the various views and illustrative embodiments, like reference numbers are used to designate like elements.

One of the interconnect structures in dies diced from a stacked wafer/chip system is through silicon via (TSV), or alternatively termed through oxide vias (TOV). TSV is a trench filled with conductive materials such as copper, penetrating through an interface between two bonded wafers. A depth of the TSV can be in a range of from about 3 µm to about 6 µm. In a cross section showing all the wafers or substrates in a stacked wafer system, a width of one TSV may not be consistent along the direction of the depth of the TSV. For example, a portion of the TSV that is closer to a substrate or a wafer may possess a greater width than a portion of the TSV that is closer to a landing metal pad or a metal line in a dielectric layer. Of course, in the cross section, a TSV can include multiple segments with various widths. The TSV can be composed of multiple segments of metal lines or metal trenches that horizontally extending in a metal layer, and multiple segments of metal vias that vertically extending across adjacent metal layers. The metal line, metal trenches and metal vias discussed herein are referred to elongated spaces surrounded by dielectric layers and filled with conductive materials.

The metal trenches or metal vias are surrounded by dielectric layers. For instance, the dielectric layer can be low-k dielectric layer in order to reduce resistance and capacitance (RC) delay and hence improve device performance. The low-k dielectric layer may include a low-dielectric constant material such as methyl silsesquioxane (MSQ), a MSQ derivative, hydridosilsesquioxane (HSQ), a HSQ derivative, an oxide and MSQ hybrid, a porogen/MSQ hybrid, an oxide and HSQ hybrid, a porogen/HSQ hybrid, silicon carbide, or combinations thereof. Alternatively, the low-k dielectric layer may include a porous dielectric. The low-k dielectric layer include other low-dielectric constant materials, such as nanoporous silica, xerogel, polytetrafluoroethylene (PTFE), or low-dielectric constant (low-k) materials such as SiLK available from Dow Chemicals of Midland, Mich., Flare, available from Allied Signal of Morristown, N.J., and Black Diamond, available from Applied Materials of Santa Clara, Calif., as examples, although other low-k materials may also be used. The low-k dielectric layer is deposited using a chemical vapor deposition (CVD) or a spin-on coating technique, although other deposition techniques may alternatively be used.

Despite their advantages, low-k materials raise many problems relating to their integration into conventional processing methods. One process integration issue of particular concern is in the formation of conductive interconnect structures, such as in the damascene process. The damascene process typically includes etching with a high-energy plasma. The low-k materials are susceptible to damage from a plasma etch because they are softer, less chemically stable, more porous, or any combination of these factors. Condition may be more severe when stacked dielectric layer, for example, a black diamond/SiC stack, is utilized in low-k dielectric layer. Due to a difference with respect to plasma resistance between black diamond and SiC, the high energy plasma etch can generate non-uniform lateral etch. For instance, the black diamond layer may be more susceptible to the plasma etch and overetch concave features can be developed. Whereas the SiC may be more resistant to the same plasma etch and underetch convex features can be developed. Consequently, the black diamond/SiC stack being etched demonstrates wavy TSV trench sidewall profiles as a result of non-uniform lateral etch. The quality of a diffusion barrier and/or a seed layer subsequently deposited over the trench wavy sidewall can be deteriorated and may impact the quality of conductive materials filled into the trench. Voids can be observed in the conductive materials formed in the trench, and the poor diffusion barrier can cause metal contamination to other portions of the semiconductor devices, compromising device quality and reliability.

The present disclosure provides a semiconductor structure that effectively improves TSV trench sidewall profile uniformity, especially when an alternating low-k stack is adopted as dielectric materials. In some embodiments, a two-step etching operation is introduced to form a TSV with a depth more than about 4 µm, and having a uniform sidewall profile abutting the low k materials in the dielectric layer. In some embodiments, a one-step etching operation is introduced to form a TSV with a depth more than about 4 µm, and having a uniform sidewall profile abutting the low k materials in the dielectric layer. In one embodiment, the protection layer is composed of materials different from the low-k dielectric layer surrounding the TSV. For example, the protection layer can be made of silicon oxides or polymer layer, whereas the low-k dielectric layer can be in a SiC/black diamond stack. For another example, Si—H bonds can be observed in the protection layer. In addition, the protection layer is positioned at the sidewall, extending along a longitudinal direction of the TSV, while the SiC/black diamond stack is surrounding the TSV and extending in a direction perpendicular to the longitudinal direction of the TSV.

Figure 2:
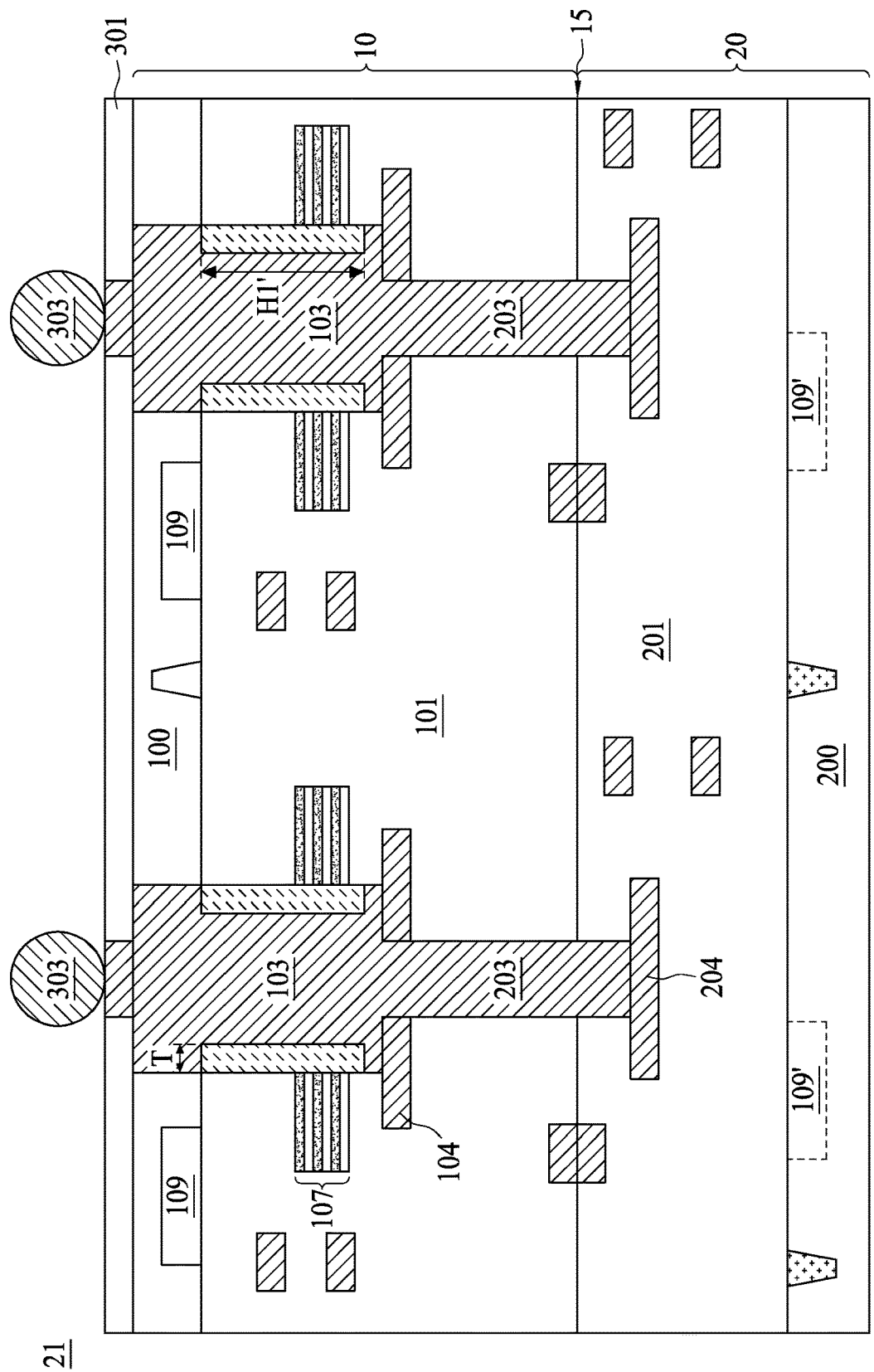
FIG. 2 is a cross section of a stacked semiconductor wafer or a stacked semiconductor chip, in accordance to some embodiments of the present disclosure.
Figure 3:
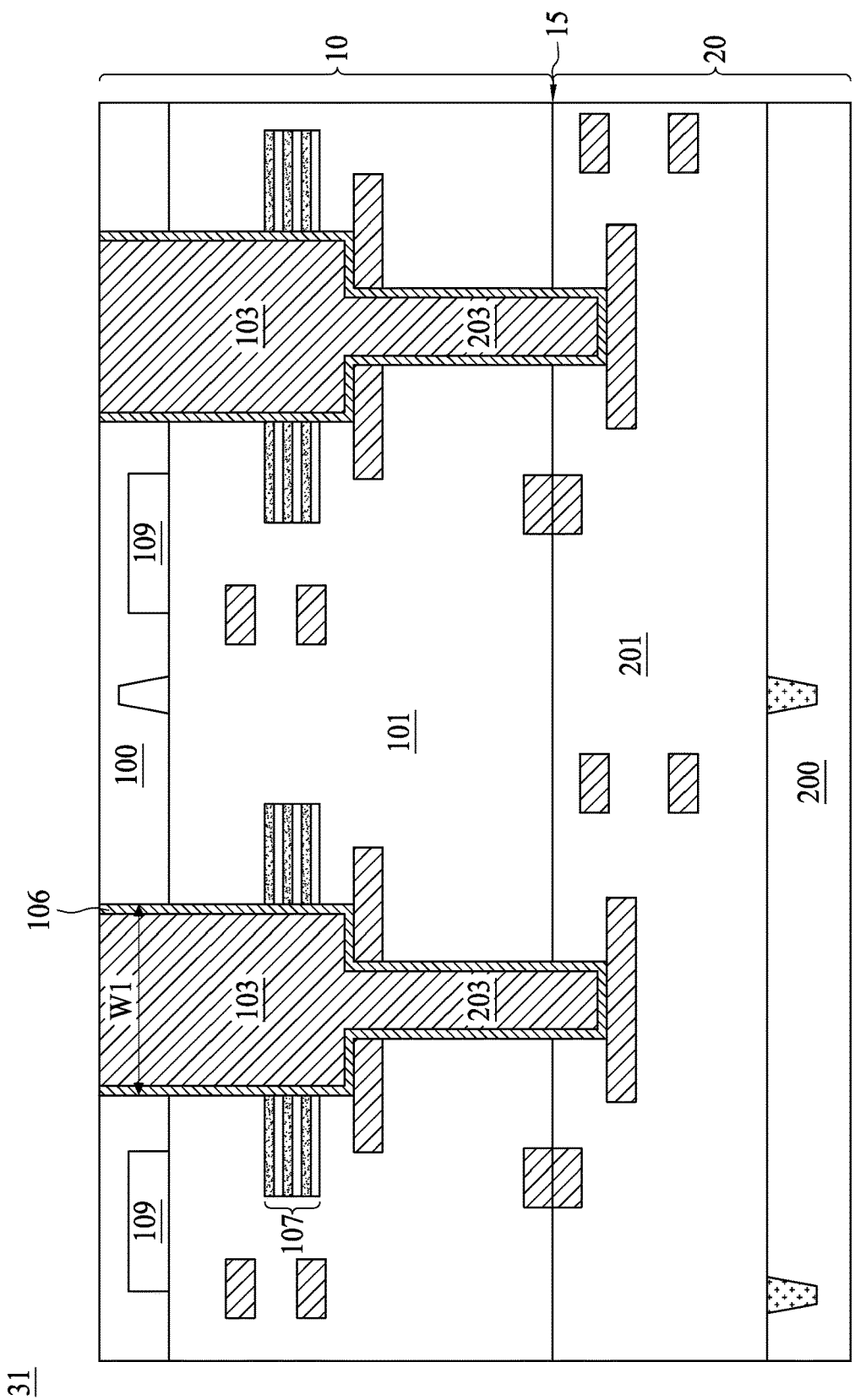
FIG. 3 is a cross section of a stacked semiconductor wafer or a stacked semiconductor chip, in accordance to some embodiments of the present disclosure.

FIG. 1 to FIG. 3 show three embodiments of the present disclosure. However, embodiments encompassed by the contemplated scope of the present disclosure are not limited to those presented herein. FIG. 4 to FIG. 9 show manufacturing operations of a semiconductor structure shown in FIG. 1. FIG. 10 to FIG. 14 show manufacturing operations of a semiconductor structure shown in FIG. 2. FIG. 15 to FIG. 25 show manufacturing operations of a semiconductor structure shown in FIG. 3.

Referring to FIG. 1, FIG. 1 is a cross section of a stacked semiconductor structure 11, in accordance with some embodiments of the present disclosure. A first chip 10 of the stacked semiconductor structure 11 includes a first substrate 100. A special purpose device, such as an image sensor, can be built in the first substrate 100. A second chip 20 of the stacked semiconductor structure 11 includes a second substrate 200. In some embodiments, the second chip 20 is a read-out chip, for example, through metal-to-metal bonding or a hybrid bonding including both the metal-to-metal bonding and the oxide-to-oxide bonding. In other embodiments, the second chip 20 is a peripheral chip. A peripheral chip, for example, includes Image Signal Processing (ISP) circuits with Analog-to-Digital Converters (ADCs), Correlated Double Sampling (CDS) circuits, row decoders, and the like. The first chip 10 and the second chip 20 are bonded at wafer level and diced into chips as final products. However, the stacked semiconductor structure 11 is not limited to a stacked chip as discussed above. The stacked semiconductor structure 11 illustrated in FIG. 1 can be a portion of a bonded semiconductor wafer before dicing.

As shown in FIG. 1, In some embodiments, an interface 15 between the first chip 10 and the second chip 20 is formed by a hybrid bonding with no extra pressure applied, and may be performed at room temperature (for example, around 21 degrees Celsius). The top dielectric layer (not shown) of first chip 10 is bonded to the top dielectric layer (not shown) of the second chip 20 through surface bonding while metal pads 102 are bonded to metal pads 202. However, the wafer bonding can be carried out under extra pressure and elevated temperature so long as the devices in the first substrate 100 or the devices in the second substrate 200 are not damaged. A first dielectric layer 101 is positioned between the first substrate 100 and the interface 15. The first dielectric layer 101 has two surfaces. A first surface 101A of the first dielectric layer 101 is in proximity to the first substrate 100. In some embodiments, the first surface 101A is connecting to a top surface of the substrate 100. A second dielectric layer 201 is positioned between the second substrate 200 and the interface 15. The second dielectric layer 101 has two surfaces. A third surface 201A of the second dielectric layer 201 is in proximity to the second substrate 200. In some embodiments, the third surface 201A is connecting to a top surface of the substrate 200. The second surface 101B of the first dielectric layer 101 and the fourth surface 201B of the second dielectric layer 201 are connected at the interface 15 of the two chips 10, 20, and can be collectively referred to an interface 15.

Referring to FIG. 1, through silicon via (TSV) 103, 203 filled with conductive materials (hereinafter "TSV") are shown to connect devices in the first substrate 100 and the devices or circuits in the second substrate 200. The TSV includes a first interconnect 103 penetrating a first surface 101A of the first dielectric layer 101, that is, the first interconnect 103 is formed through the thickness of the first substrate 100 and entering an interconnect network in the first dielectric layer 101, landing on a metal pad 104. In some embodiments, the first interconnect 103 is a horizontal metal line that electrically couple the signal lines within a same metal layer. However, in other embodiments, the first interconnect 103 is a vertical metal via that connect signal lines or pads in different metal layers. The first interconnect 103 can be made of conductive materials such as copper or aluminum. A height H1 of the first interconnect 103 can be in a range of from about 0.5 µm to about 1.5 µm.

Still referring to FIG. 1, a protection layer 105 is surrounding the first interconnect 103, positioned as an interface between the first interconnect 103 and the first dielectric layer 101. In some embodiments, a thickness T of the protection layer 105 is in a range of from about 0.02 µm to about 0.2 µm. The protection layer 105 can be made of dielectric materials such as low-k dielectric or silicon oxides. A portion 107 of the first dielectric layer 101 in proximity to the protection layer 105 can be in a stacked form. For example, the portion 107 of the first dielectric layer 101 can be an alternating dielectric layer with at least two different materials having different resistance to an etchant capable of removing the first dielectric layer 101. In some embodiments, the alternating dielectric layer can be a silicon carbide 107A/black diamond 107B stack. FIG. 1 only shows the portion 107 of the first dielectric layer 101 in proximity to the protection layer 105. However, the stacked feature in the first dielectric layer 101 can be laterally extended throughout the first dielectric layer 101. In some embodiments, the protection layer 105 is made of materials different from that of the first dielectric layer 101. In addition, the protection layer is disposed along a longitudinal direction of the first interconnect 103, whereas the stacked feature of the portion 107 of the first dielectric layer 101 is extending in a direction perpendicular to the longitudinal direction of the first interconnect 103.

In FIG. 1, a height H1 of the protection layer 105 can be identical to the height H1 of the first interconnect 103. As discussed earlier for the thickness T of the protection layer 105, an aspect ratio of the protection layer 105 is more than 5. In some embodiments, additional layers such as a diffusion barrier (Ta/TaN) or a seed layer for subsequent conductive material formation can be disposed between the protection layer 105 and the first interconnect 103. A thickness of the diffusion barrier and the seed layer (usually in tens of nanometers) is thinner than the thickness of the protection layer 105. In some embodiments, the protection layer 105 is a layer that is capable of preventing the etchant used for removing the portion 107 of the first dielectric layer 101 from damaging an interface between the portion 107 and the first interconnect 103.

In some embodiments, the TSV may further include a second interconnect 203 penetrating the interface 15. The second interconnect 203 and the first interconnect 103 are electrically connected. In some embodiments as shown in FIG. 1, a width W1 of the first interconnect 103 is greater than a width W2 of the second interconnect 203. As can be seen in FIG. 1, the first interconnect 103 passes through the two adjacent metal pads 104 in the first dielectric layer 101, and the second interconnect 203 is formed by etching away the first dielectric layer 101 and the second dielectric layer 201, eventually landing on a metal pad 204 in the second dielectric layer 201. In other embodiments, a width W1 of the first interconnect 103 is substantially identical to a width W2 of the second interconnect 203. For example, in some embodiments, the first interconnect 103 lands on a metal pad 104 in the first dielectric layer 101, and the second interconnect 203 is formed by etching away a middle portion of the metal pad 104 and further down to the second dielectric layer 201, eventually landing on a metal pad 204 in the second dielectric layer 201. A total height H2 combining the height H1 of the first interconnect 103 and a height of the second interconnect 203 is in a range of from about 4 µm to about 5 µm.

Referring to FIG. 2, a stacked semiconductor structure 21 is shown to have only a portion of the sidewall of the first interconnect 103 being deposited with the protection layer 105. In some embodiments, the protection layer 105 is not deposited on the portion of the sidewall connecting with the first substrate 100. In other embodiments, the protection layer 105 is not in connection with the metal pad 104. A thickness T of the protection layer 105 in FIG. 2 is similar to those discussed above, but a height H1' thereof may be smaller than the protection layer 105 shown in FIG. 1. Although only a portion of the sidewall of the first interconnect 103 is deposited with the protection layer 105, the materials of the first interconnect 103 is separated and thus protected by the protection layer 105 from the portion 107 of the first dielectric layer 101. Note in FIG. 2, the first chip 10 is an image sensor chip containing front side CMOS image sensors 109 in the first substrate 100, and the second chip 20 is an ASIC or a peripheral circuit chip. Alternatively, the second chip 20 is a backside CMOS image sensor 109' chip, while the first chip 10 is an ASIC or a peripheral circuit chip. As shown in FIG. 2, backside illuminated CMOS image sensors 109' illustrated in dotted lines can be located in the second substrate 200 of the second chip 20. For example, a backside grinding is performed to thin down the second substrate 200, and the thickness of substrate 200 is reduced to a desirable value. With the second substrate 200 having a small thickness, light may penetrate from back surface 200A into second substrate 200, and reach a backside CMOS image sensors 109'. Passivation layer 301, which may be an oxide layer such as a silicon oxide layer, a silicon nitride layer, or multi-layers thereof, is positioned over the first substrate 100. TSVs 103, 203 penetrate the first substrate 220 and land on metal pads 204 in chip 20, and are electrically coupled to logic circuits in chip 200. Electrical connectors 303, which may be solder bumps, copper pillars, composite connectors including metal pillars and pre-solder layers, or the like, are then formed to electrically couple to TSVs 103, 203.

Referring to FIG. 3, the semiconductor structure 31 having a TSV 103, 203 penetrating the first dielectric layer 101 and the second dielectric layer 201 is free of protection layer at the sidewall of the first interconnect 103. A barrier seed layer 106 is illustrated at the sidewall of the first interconnect 103 and the second interconnect 203. In some embodiments of the present disclosure, a method is provided for manufacturing a TSV as illustrated in FIG. 3 with uniform interface between the first interconnect 103 and the portion 107 of the first dielectric layer 101 having an alternating stack feature. The method can be referred to the description of FIG. 15 to FIG. 25 in the present disclosure.

Figure 4:
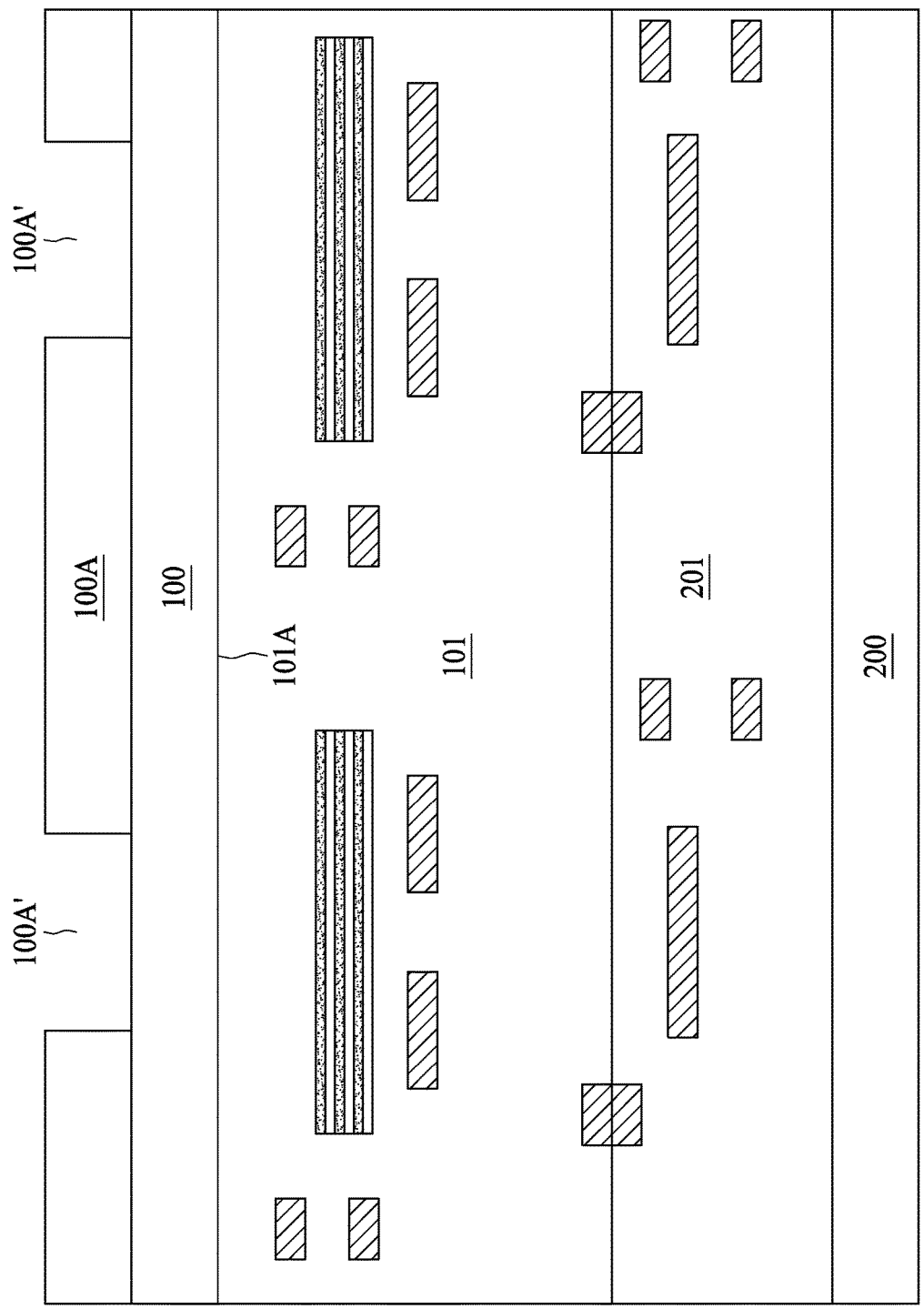
FIG. 4 to FIG. 9 are cross sectional fragmental views of operations for manufacturing a stacked semiconductor wafer or a stacked semiconductor chip, in accordance to some embodiments of the present disclosure.
Figure 5:
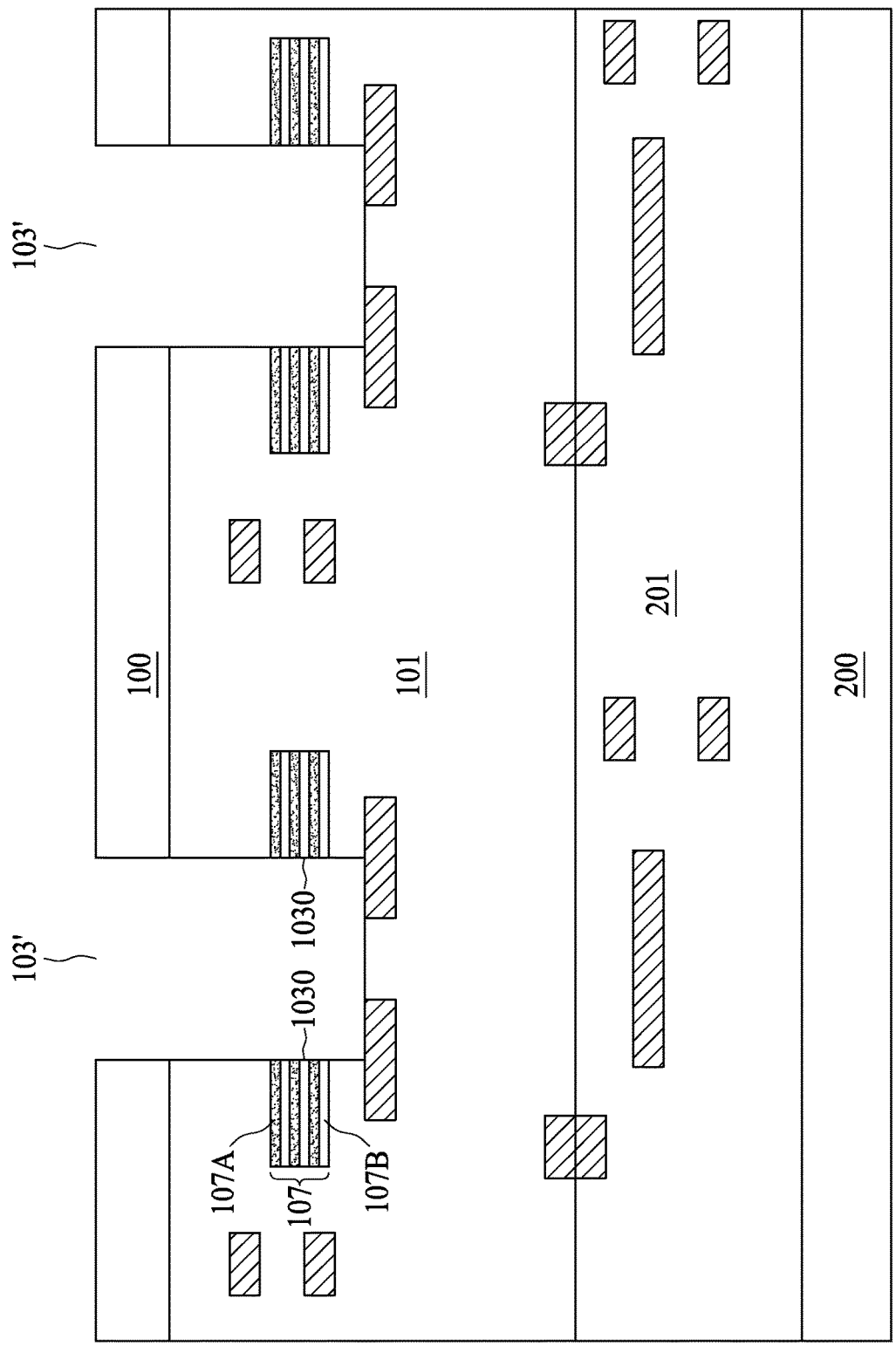

FIG. 4 to FIG. 9 show manufacturing operations of a semiconductor structure 11 shown in FIG. 1. Referring to FIG. 4 and FIG. 5, a first trench 103' is formed in the first dielectric layer 101 having a surface 101A in proximity to the first substrate 100. The first trench 103' is formed by removing a portion of the first substrate 100 and a portion of the first dielectric layer 101 that are not covered by a first mask 100A. In some embodiments, the first mask 100A is a photoresist layer having a thickness of from about 3.5 µm to about 5 µm and a critical dimension of the openings 100A' in the first mask 100A is from about 3 µm to about 4 µm. The formation of the first trench 103' may include a silicon etch operation followed by an oxide etch operation. In some embodiments, the portion of the first dielectric layer 101 is removed by reactant gas mixtures and etching parameters are adjusted for each layer to achieve a high etch rate for each layer as it is reached. An endpoint sensor, such as an optical emission spectrometer, provides continuous monitoring of the etching process and indicates when etchant gases are to be changed to accommodate either a silicon layer or a dielectric layer. In some embodiments, the silicon layer is etched with a gas mixture containing chlorine or bromine. Etchant gas mixtures and plasma parameters for etching the various dielectric layers are well known to those skilled in the art and may be experimentally optimized for each application.

Figure 6:
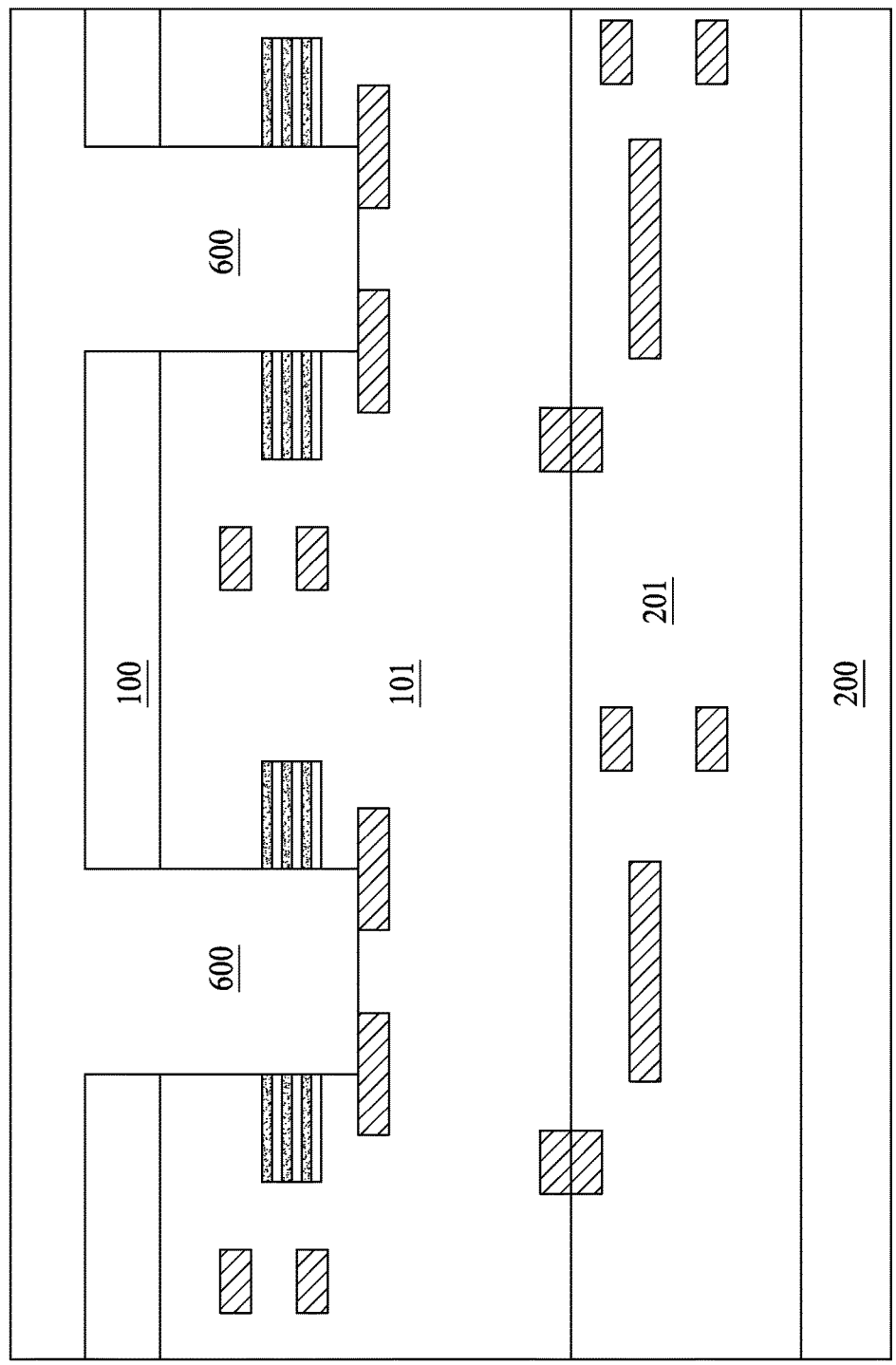
Figure 7:
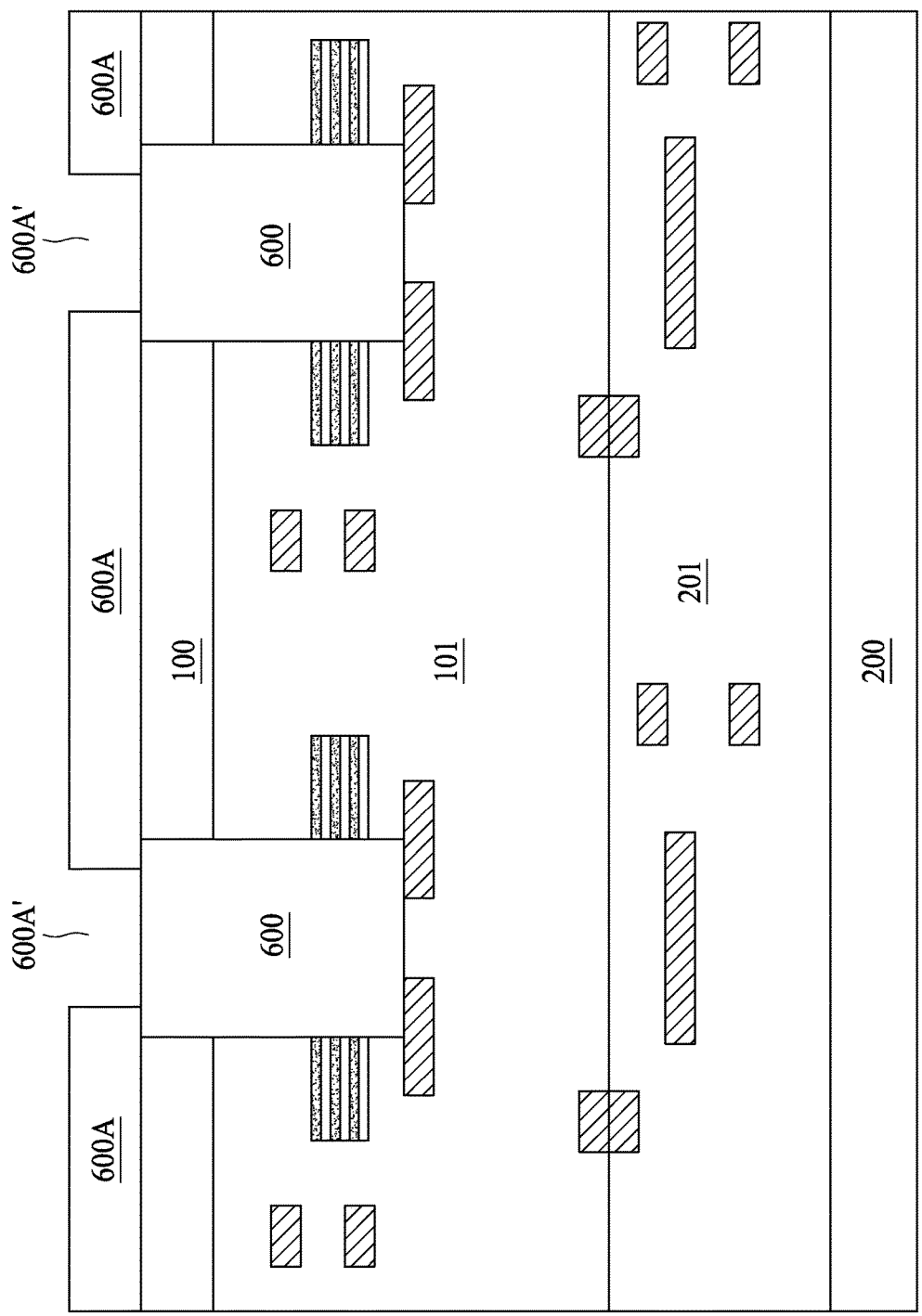
Figure 8:
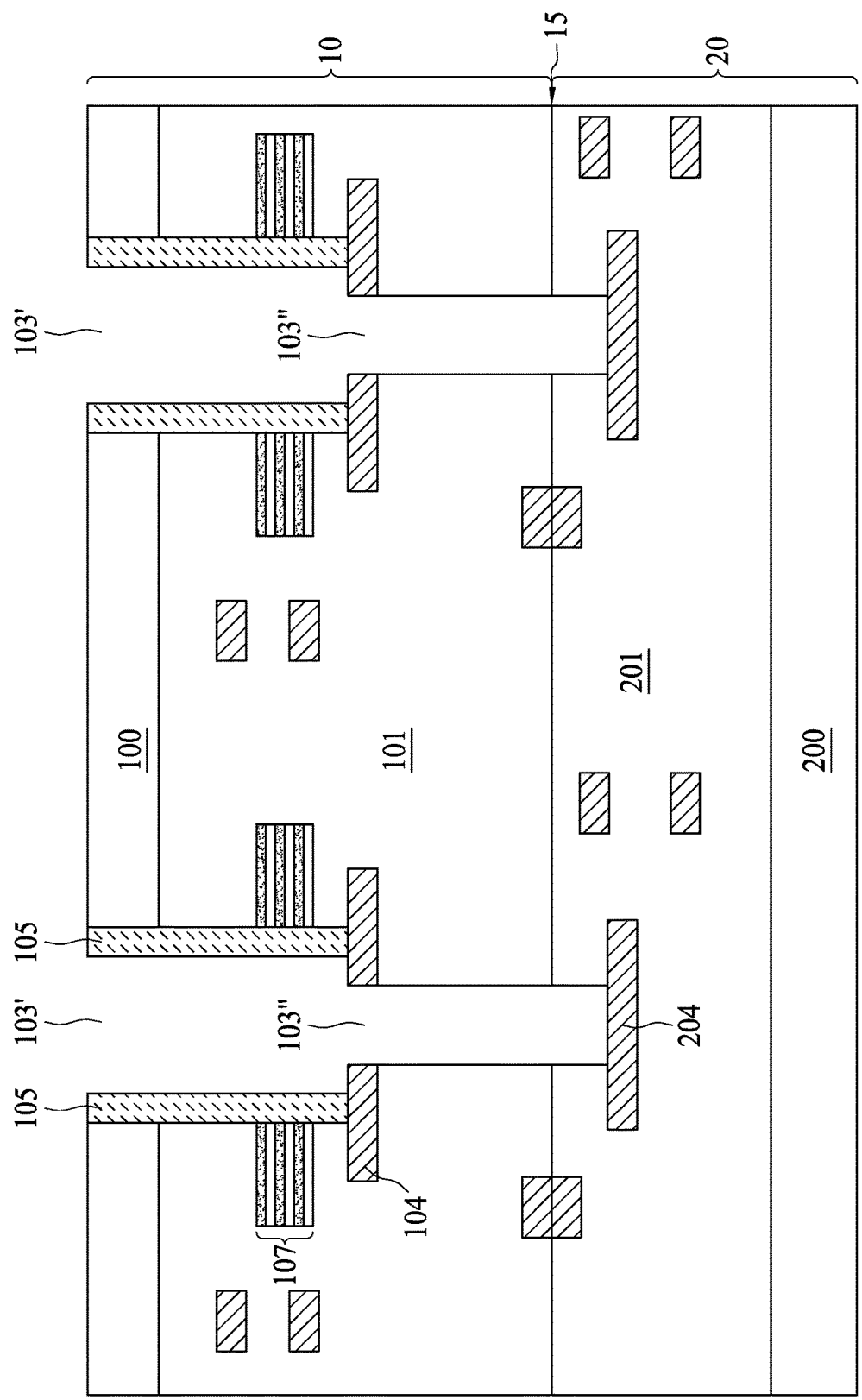

As shown in FIG. 5, a sidewall 1030 of the first trench 103' demonstrates a non-uniform profile due to uneven etch between the alternating dielectric materials in the portion 107 of the first dielectric layer 101. For example, the silicon carbide 107A is more resistant to the etchant used to remove the first dielectric layer 101 than that of the black diamond 107B, and hence a concave feature is formed at the interface between the black diamond 107B and first trench 103', while a convex feature is formed at the interface between the silicon carbide 107A and first trench 103'. Referring to FIG. 6 to FIG. 8, a sidewall protection layer 105 is formed in the first dielectric layer 101, positioned between a second trench 103" and the first dielectric layer 101. In FIG. 6, an oxide layer 600 is formed over the first substrate 100 and filled in the first trench 103'. In some embodiments, the oxide layer is formed by a flowable oxide spin-on operation. Flowable oxide referred herein includes flowable, inorganic polymer that is designed to meet industry demands for improved dielectric materials and to fill narrow trenches, including polysilazane-based inorganic SOG, F-doped HDP-CVD, $O_3$-TEOS $SiO_2$ CVD, ozone-based flowable oxide CVD and flowable oxide CVD. In some embodiments Si—H bonds can be observed in the flowable oxide layer. Flowable oxide can be a liquid solution of hydrogen silsesquioxane in a carrier solvent. As processed, the physical form is a spun-on flowable polymer cured to an amorphous film. Alternatively, the oxide layer 600 can be made of non-organic material selected from un-doped silicate glass (USG), silicon nitride, silicon oxynitride, silicon oxide, and combinations thereof. In another embodiment, the oxide layer 600 is formed of a polymer layer, such as an epoxy, polyimide, benzocyclobutene (BCB), polybenzoxazole (PBO), and the like, although other relatively soft, often organic, dielectric materials can also be used. In one embodiment, the oxide layer 600 is a polyimide layer. Oxide layer 600 may be formed on the first substrate 100 by spin coating or other commonly used methods.

In FIG. 7 and FIG. 8, a center portion of the oxide layer 600 is removed by patterning a second mask 600A on a trimmed oxide layer 600 and the first substrate 100. A chemical mechanical polishing (CMP) operation is conducted after the formation of the oxide layer 600 and prior to the disposition of the second mask 600A, and hence a top surface of the trimmed oxide layer 600 and a back surface of the first substrate 100 are substantially coplanar. A center portion of the oxide layer 600 exposed from the openings 600A' is then removed by suitable etchant, and a periphery portion of the oxide layer 600 remains at the sidewall of the first trench 103' and become a protection layer 105. As shown in FIG. 8, a second trench 103" is formed through the opening of the first trench 103'. Note in some embodiments as shown in FIG. 8, the metal pad 103 functions as an embedded hard mask which narrows a width of the second trench 103". However, in some embodiments, the metal pad 103 can be removed during the etching operation and thus a width of the first trench 103' and a width of the second trench 103" are substantially the same. Compared to the first trench 103', the second trench 103" is closer to the interface 15 of two chips 10 and 20 and thus penetrating there through, stopping at a metal pad 204 in the second dielectric layer 201.

Figure 9:
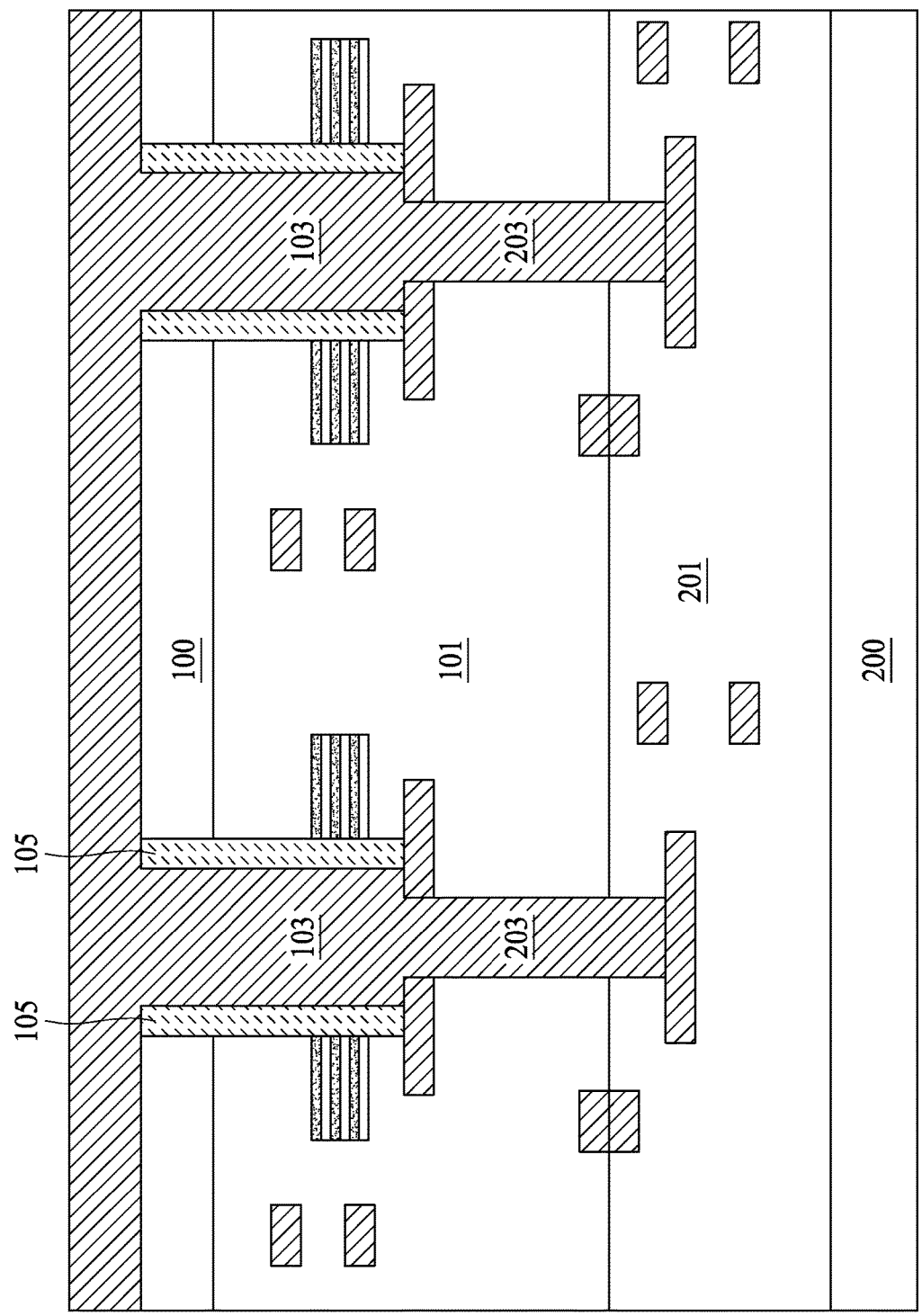

Referring to FIG. 9, conductive materials such as copper or aluminum is filled into the first trench 103' and the second trench 103", therefore the first interconnect 103 and the second interconnect 203 are formed, followed by another CMP operation to remove the conductive materials on the backside of the first substrate 100. Although not illustrated, a diffusion barrier layer can be further deposited over the coplanar surface formed by the etched back conductive materials and the first substrate 100.

Figure 10:
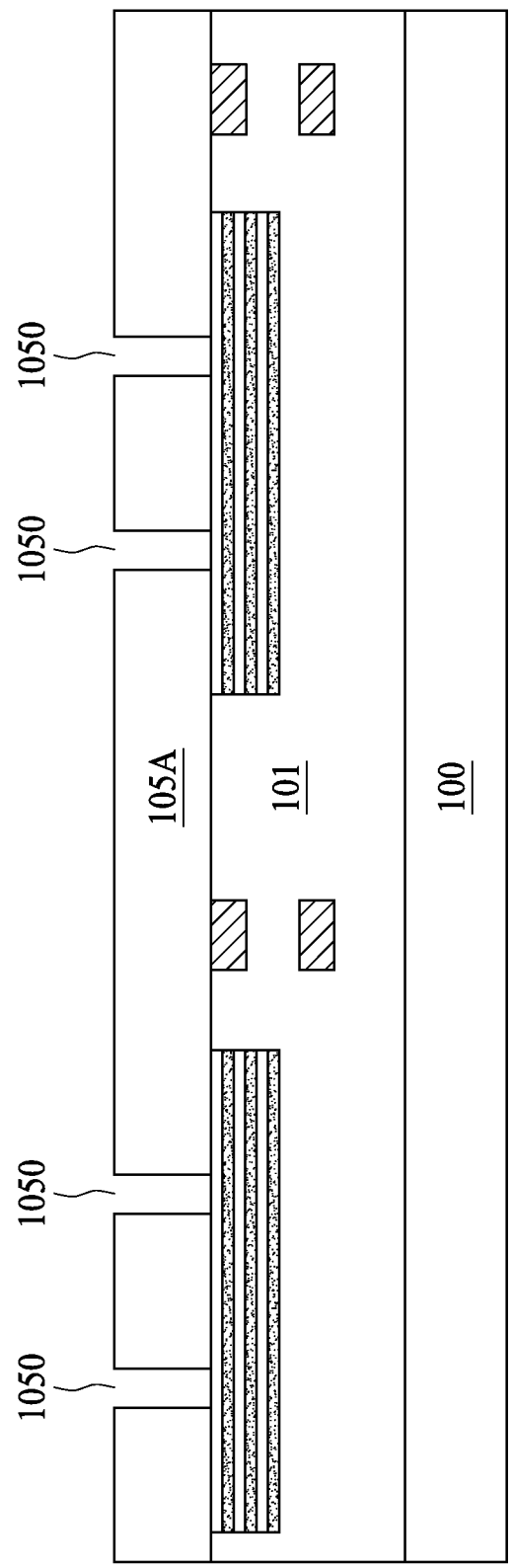
FIG. 10 to FIG. 14 are cross sectional fragmental views of operations for manufacturing a stacked semiconductor wafer or a stacked semiconductor chip, in accordance to some embodiments of the present disclosure.
Figure 11:
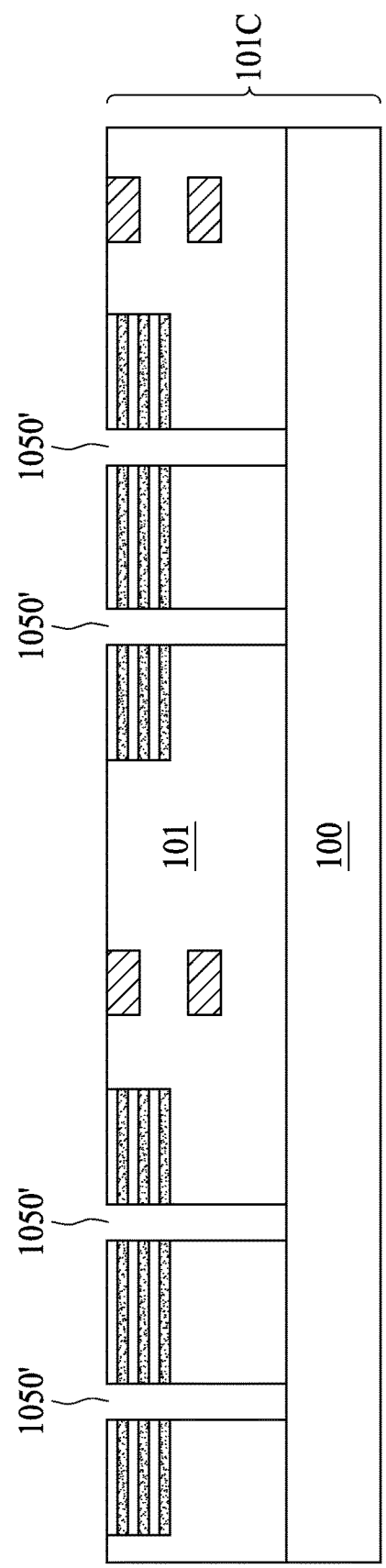
Figure 12:
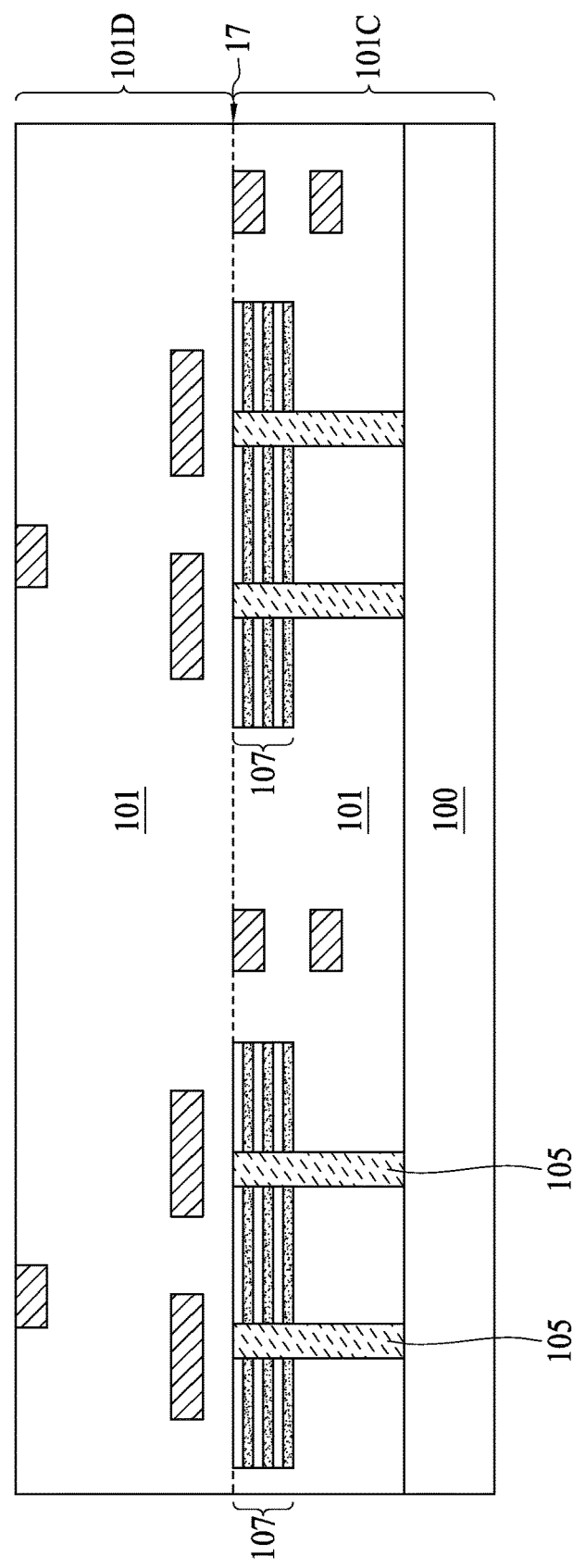

As discussed in FIG. 4 to FIG. 9, the protection layer 105 is formed after the formation of the first trench 103'. However, the present disclosure provides another method which forms the protection layer 105 prior to the forming of the first trench 103', as illustrated in FIG. 10 to FIG. 14. FIG. 10 to FIG. 14 show manufacturing operations of a semiconductor structure 21 shown in FIG. 2. Referring to FIG. 10 and FIG. 11, a hollow channel 1050' is formed in a first portion 101C of the first dielectric layer 101 through an opening 1050 of a mask 105A. Operations of removing the first dielectric layer 101 are previously discussed in FIG. 5 and can be referred thereto. Referring to FIG. 11 and FIG. 12, an oxide layer can be formed to fill the hollow channel 1050' and become a protection layer 105. A CMP operation can be conducted to planarize overfilled oxide over the first portion 101C of the first dielectric layer 101. Subsequently, a second portion 101D of the first dielectric layer 101 can be formed over the planarized surface 17 as shown in dotted line. The first portion 101C and the second portion 101D of the first dielectric layer 101 include various metal interconnect layers surrounded by suitable dielectric layer. In some embodiments, the dielectric layer includes alternating dielectric stack with at least two dielectric materials having different resistance to an etchant capable of removing the first dielectric layer 101.

Figure 13:
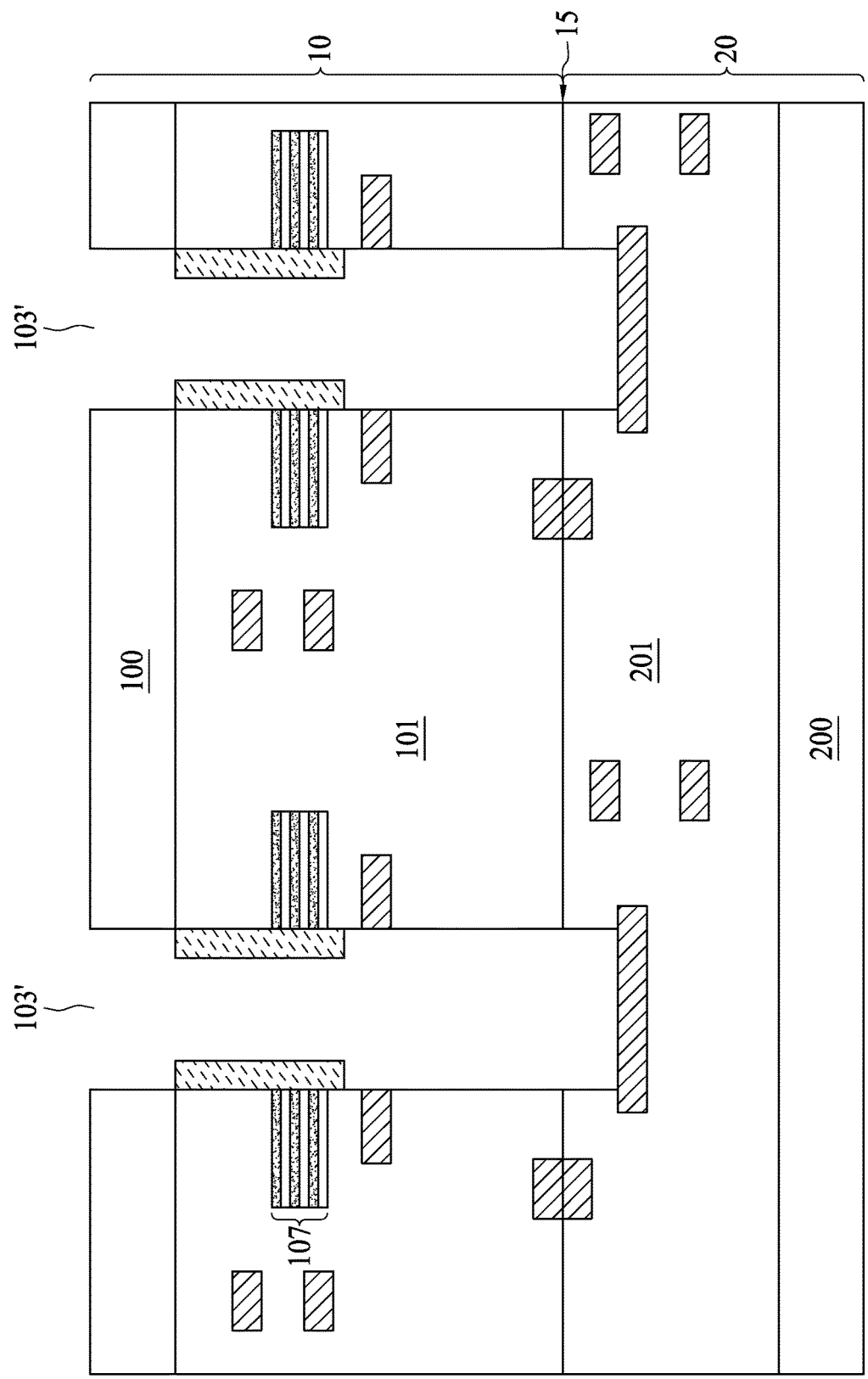
Figure 14:
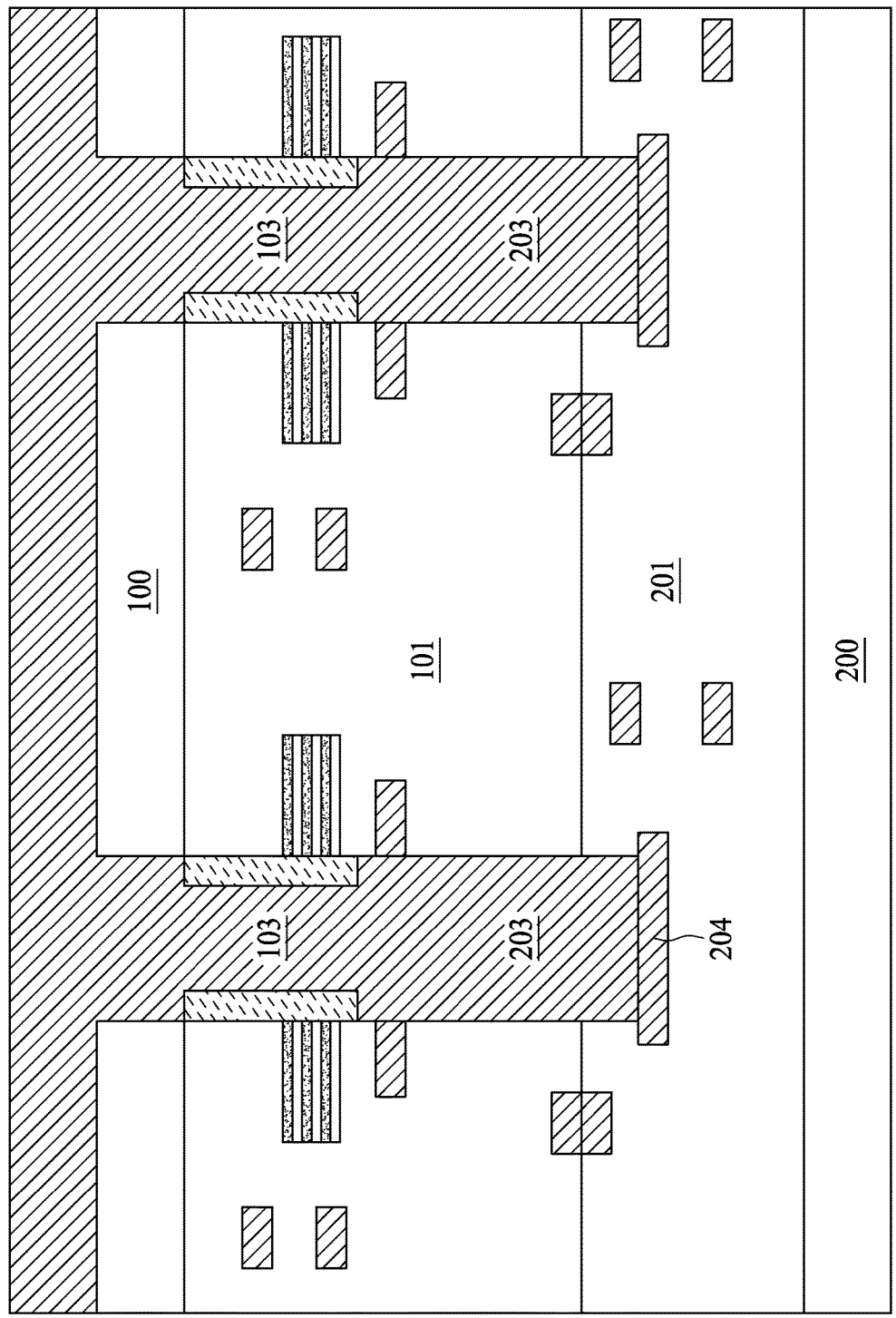

Referring to FIG. 13 and FIG. 14, a second chip 20 is bonded to the first chip 10 at the interface 15 between the first dielectric layer 101 and the second dielectric layer 201. A first trench 103' is formed by etching through the first substrate 100, the first dielectric layer 101, and a portion of the second dielectric layer 201. Due to the previously-formed sidewall protection layer 105, an interface of the sidewall of the first trench 103' and the portion 107 of the first dielectric layer 101 is occupied by the protection layer 105, and thus the wavy and non-uniform sidewall etching profile can be prevented. In FIG. 14, conductive materials can be filled into the first trench 103', followed by a CMP operation to form a flat surface at the back of the first substrate 100. In some embodiments, the first interconnect 103 and the second interconnect 203 can be formed in one etching operation.

Figure 15:
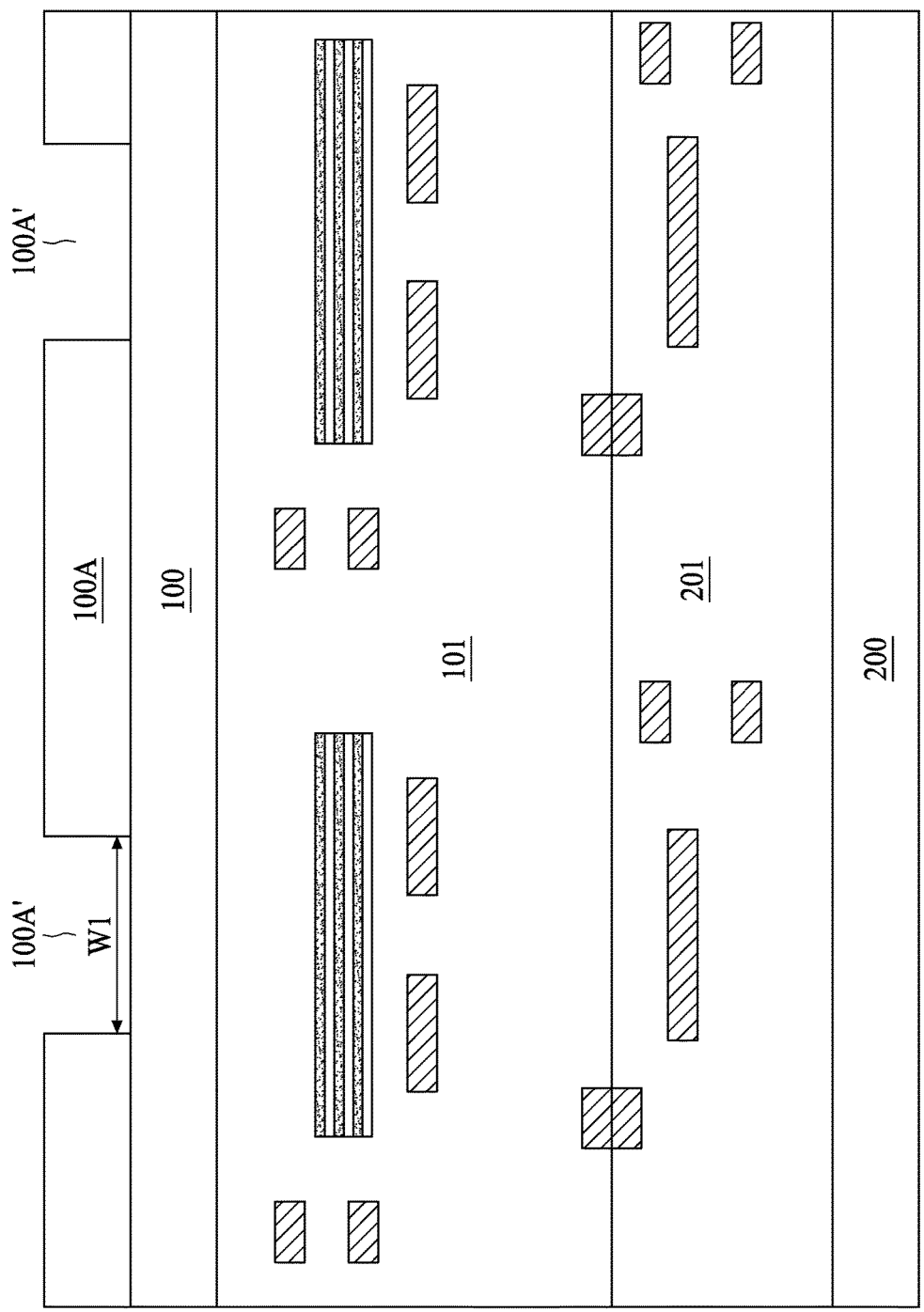
FIG. 15 to FIG. 25 are cross sectional fragmental views of operations for manufacturing a stacked semiconductor wafer or a stacked semiconductor chip, in accordance to some embodiments of the present disclosure.
Figure 16:
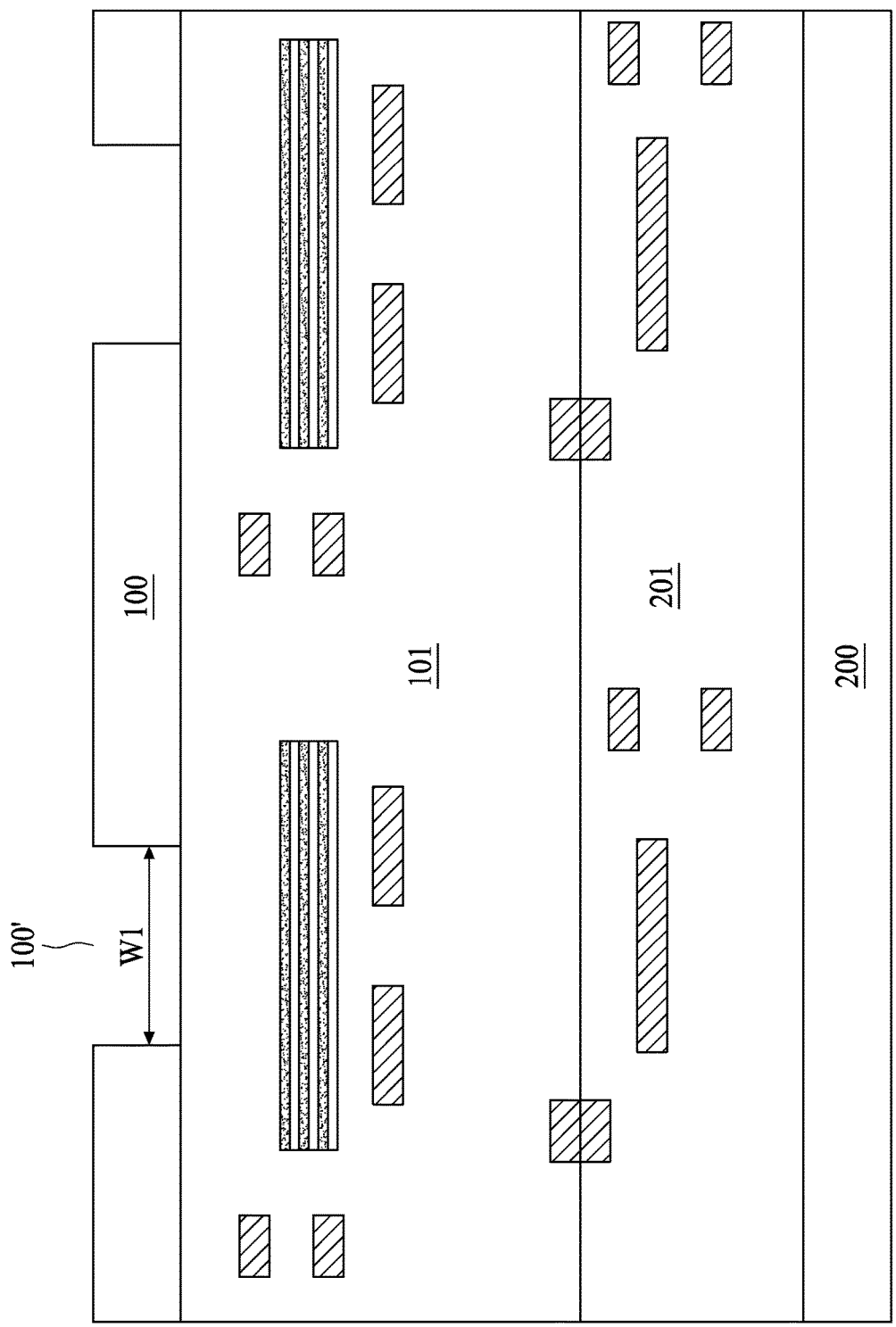
Figure 17:
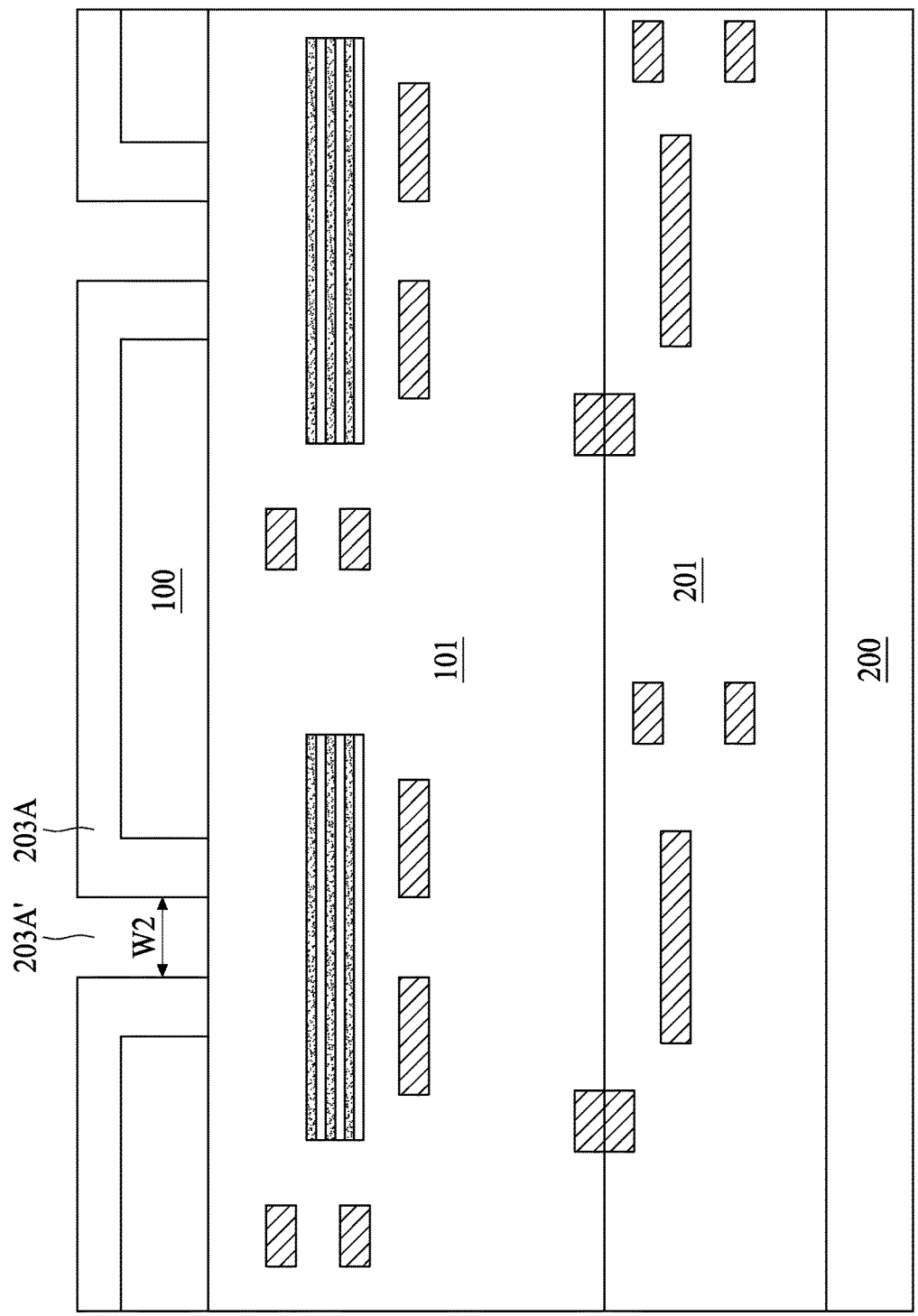
Figure 18:
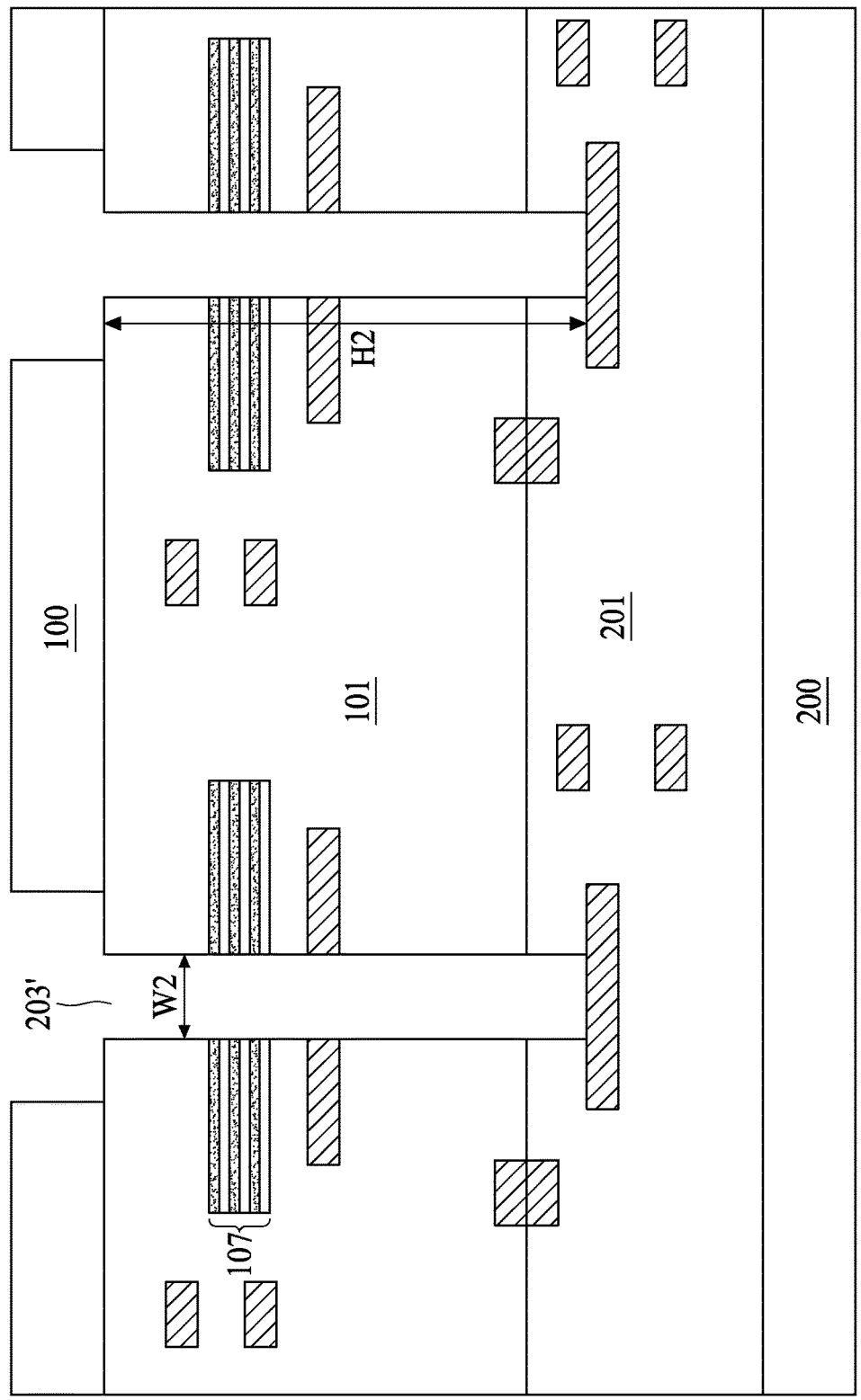

FIG. 15 to FIG. 25 show manufacturing operations of a semiconductor structure 31 shown in FIG. 3. Referring to FIG. 15 to FIG. 18, a hollow via 203' penetrating the first dielectric layer 101 and the second dielectric layer 201 is formed. In FIG. 15, a first mask 100A is patterned over the first substrate 100, having an opening 100A' with a width W1 comparable to a width of the first interconnect 103, as shown in FIG. 3. In FIG. 16, the pattern of the first mask 100A is transferred to the first substrate 100, and an opening 100' having a width W1 exposes a portion of the first dielectric layer 101. In FIG. 17, a second mask 203A is patterned over the first substrate 100 and the first dielectric layer 101. Note, in some embodiments, the second mask forms an opening 203A' between two adjacent patterned first substrate 100, covering a sidewall of said first substrate 100, and the opening 203A' having a width W2 substantially identical to a width of the second interconnect 203, as shown in FIG. 3. In FIG. 18, a portion of the first dielectric layer 101 and a portion of the second dielectric layer 201 is removed by an etching operation. Etchant used for removing the dielectric layer is previously discussed in FIG. 5 and can be referred thereto. Since a depth H2 of the hollow via 203' can be more than 4.5 µm in some embodiments, the thickness of the second mask 203A shall be adjusted accordingly to the withstand the etching operation. In FIG. 18, the portion 107 of the first dielectric layer 101 is penetrated, and in some embodiments, the etched interface between the hollow via 203' and the portion 107 of the first dielectric layer 101 is non-uniform due to different etchant resistance of the dielectric materials forming the dielectric stack.

Figure 19:
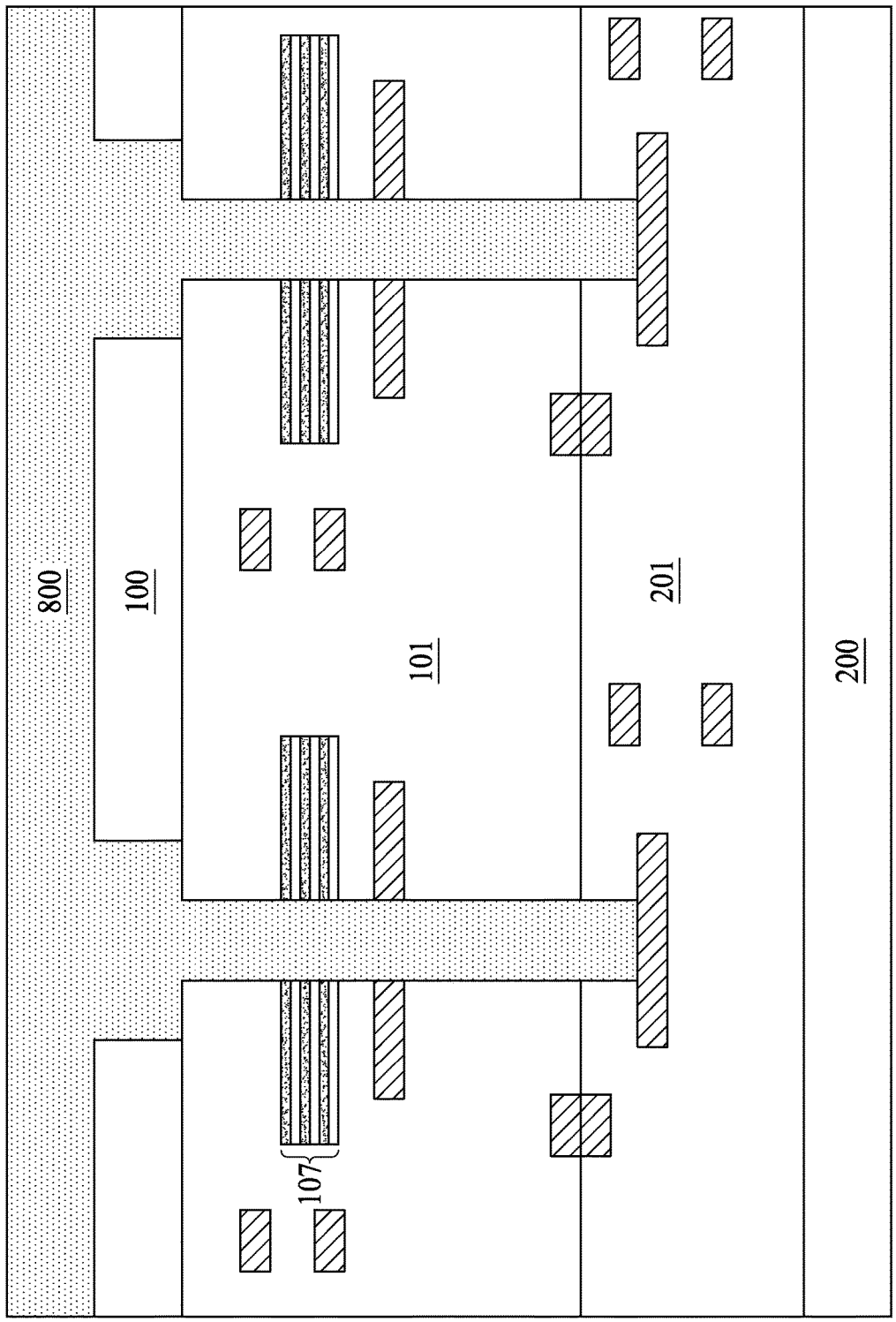
Figure 20:
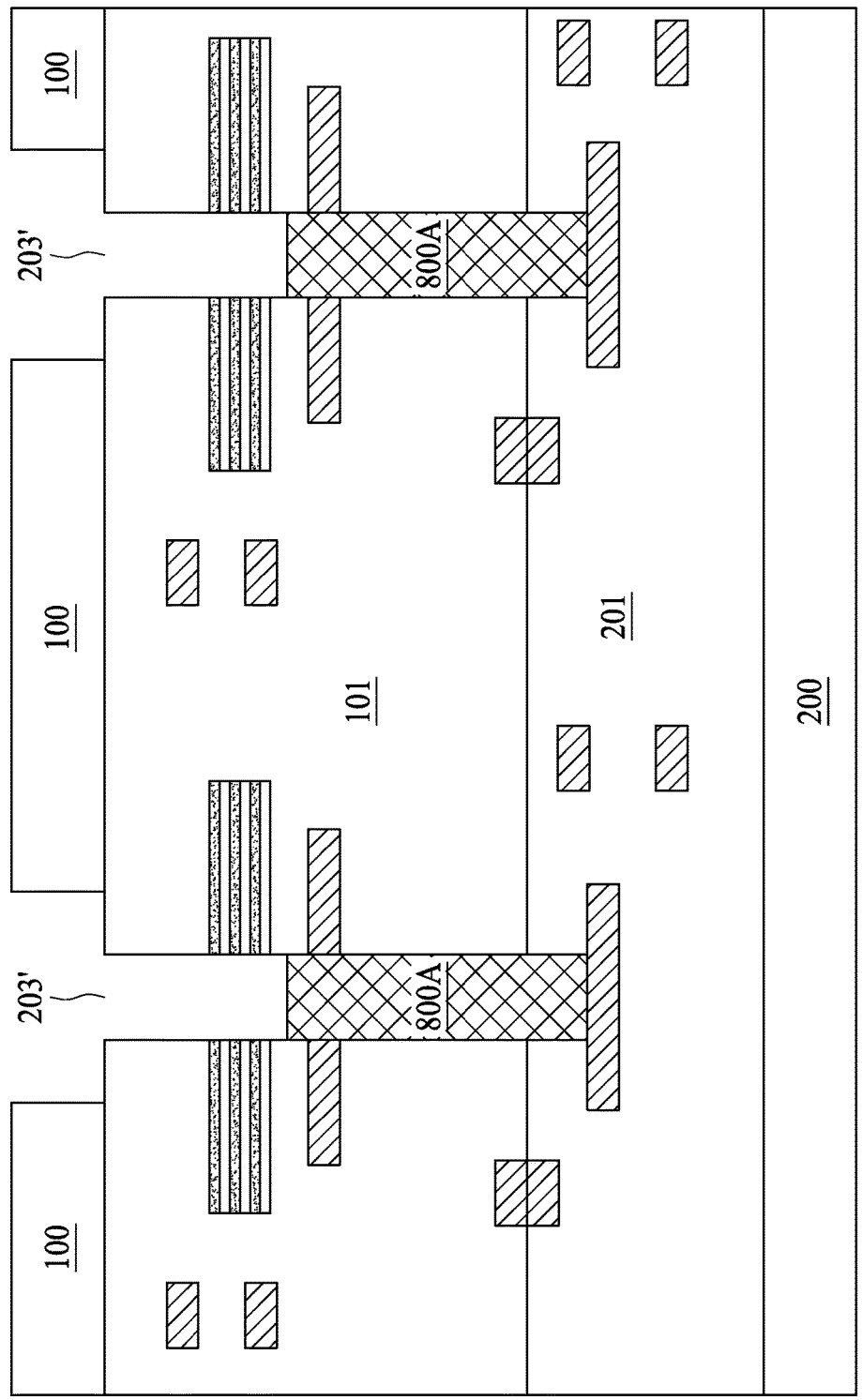

Referring to FIG. 19 and FIG. 20, a plug 800A is formed at a bottom portion of the hollow via 203' by filling curable materials 800 into the hollow via 203' as shown in FIG. 19, and removing an upper portion of the curable materials 800 by a development operation, a plasma etch back operation, or the combinations thereof. In some embodiments, the curable materials 800 can be photoresist which is capable of filling the hollow via 203'. An upper portion of the photoresist is then removed by a wet developing operation, plasma etch back operation, or the combination thereof. In other embodiments, the curable materials 800 can be dielectric materials which are capable of filling the hollow via 203'. As shown in FIG. 20, the photoresist or the dielectric materials remaining at a bottom portion of the hollow via 203' is cured and become a plug 800A. The curing may be performed in a Rapid Thermal Processing (RTP) equipment with a radiation source. In one embodiment, the curing process lasts between approximately one to ten minutes and occurs at a temperature of approximately 250 degrees Celsius to around 450 degrees Celsius. Alternatively, the curing may be done by e-beam or UV.

Figure 21:
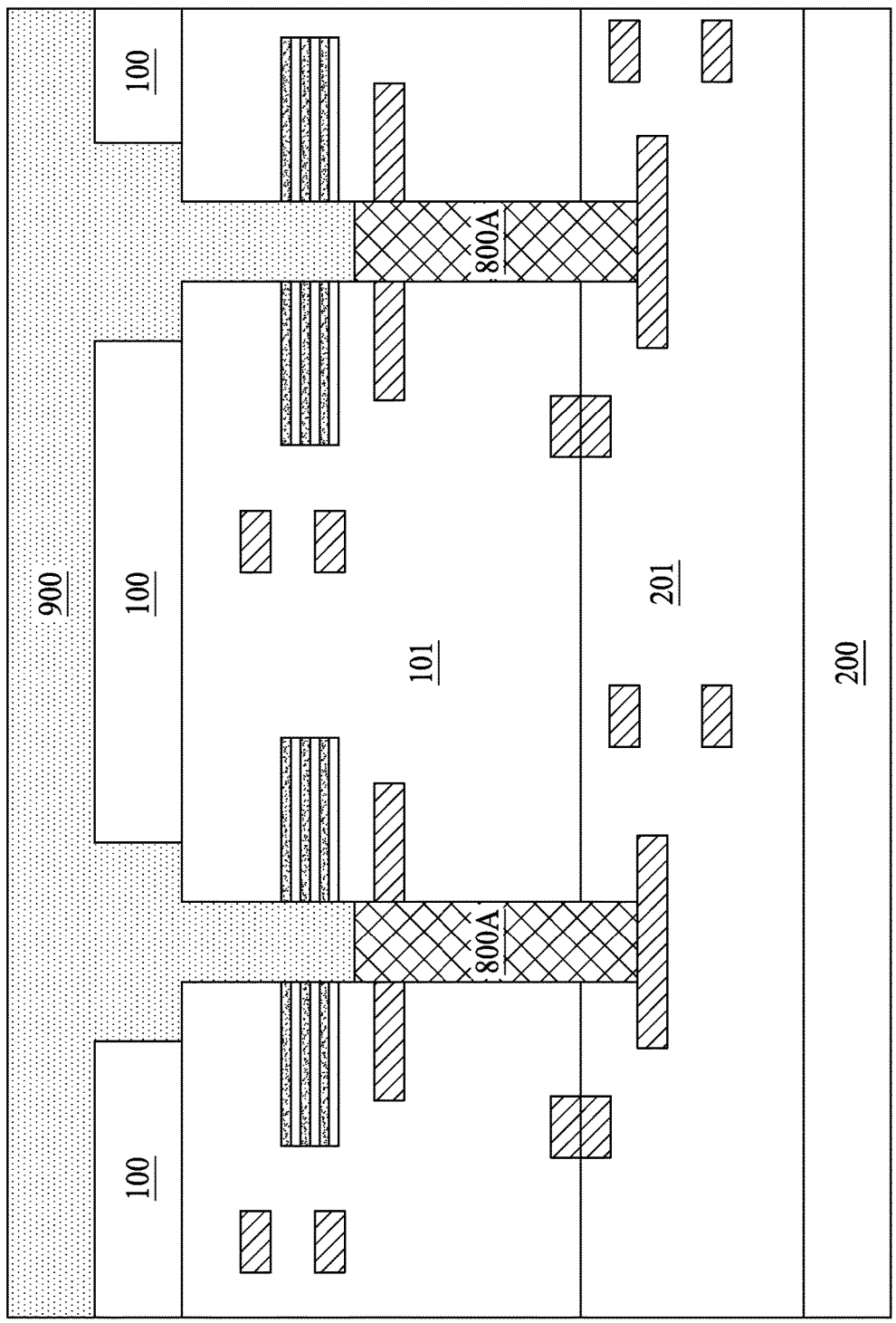
Figure 22:
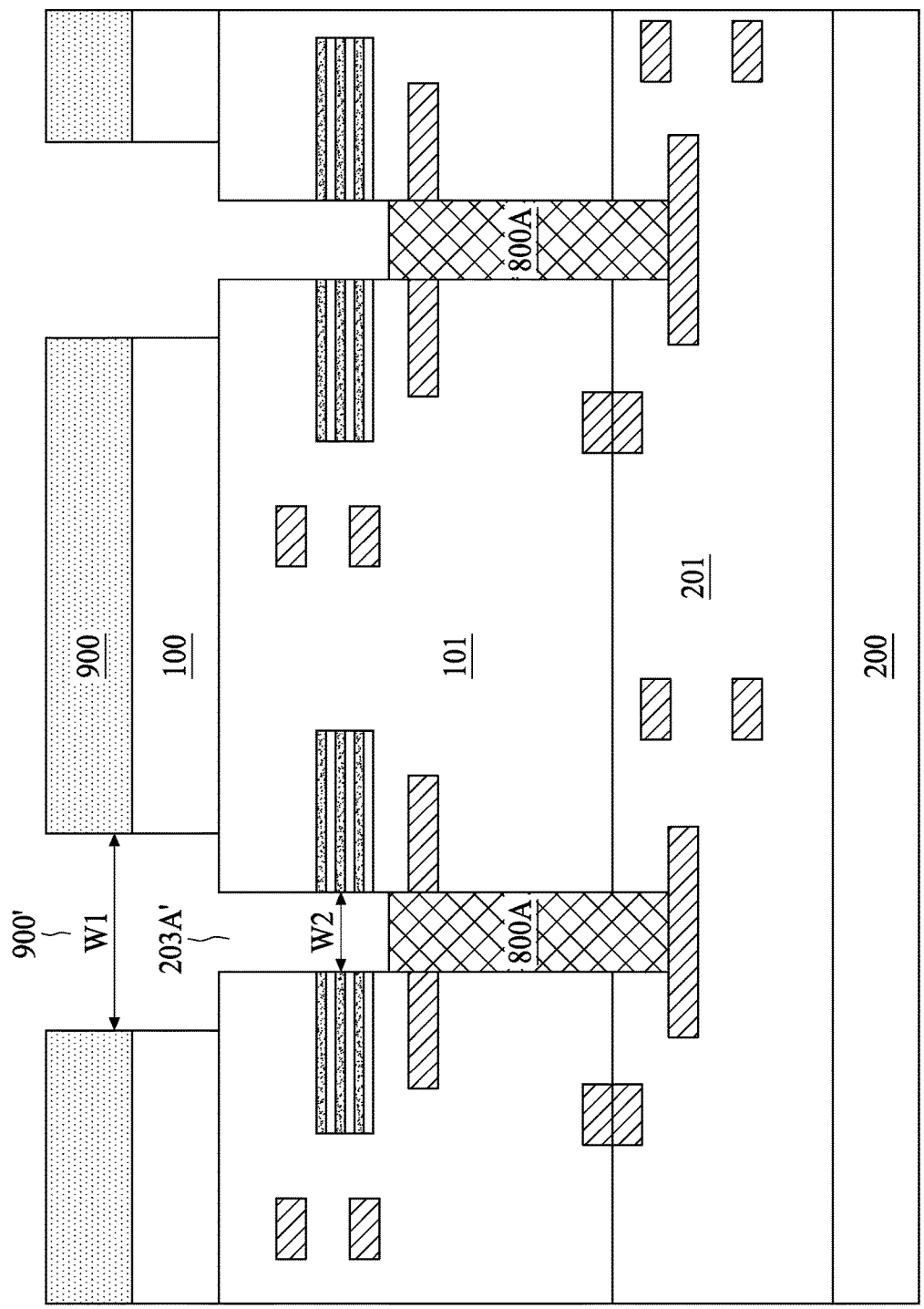
Figure 23:
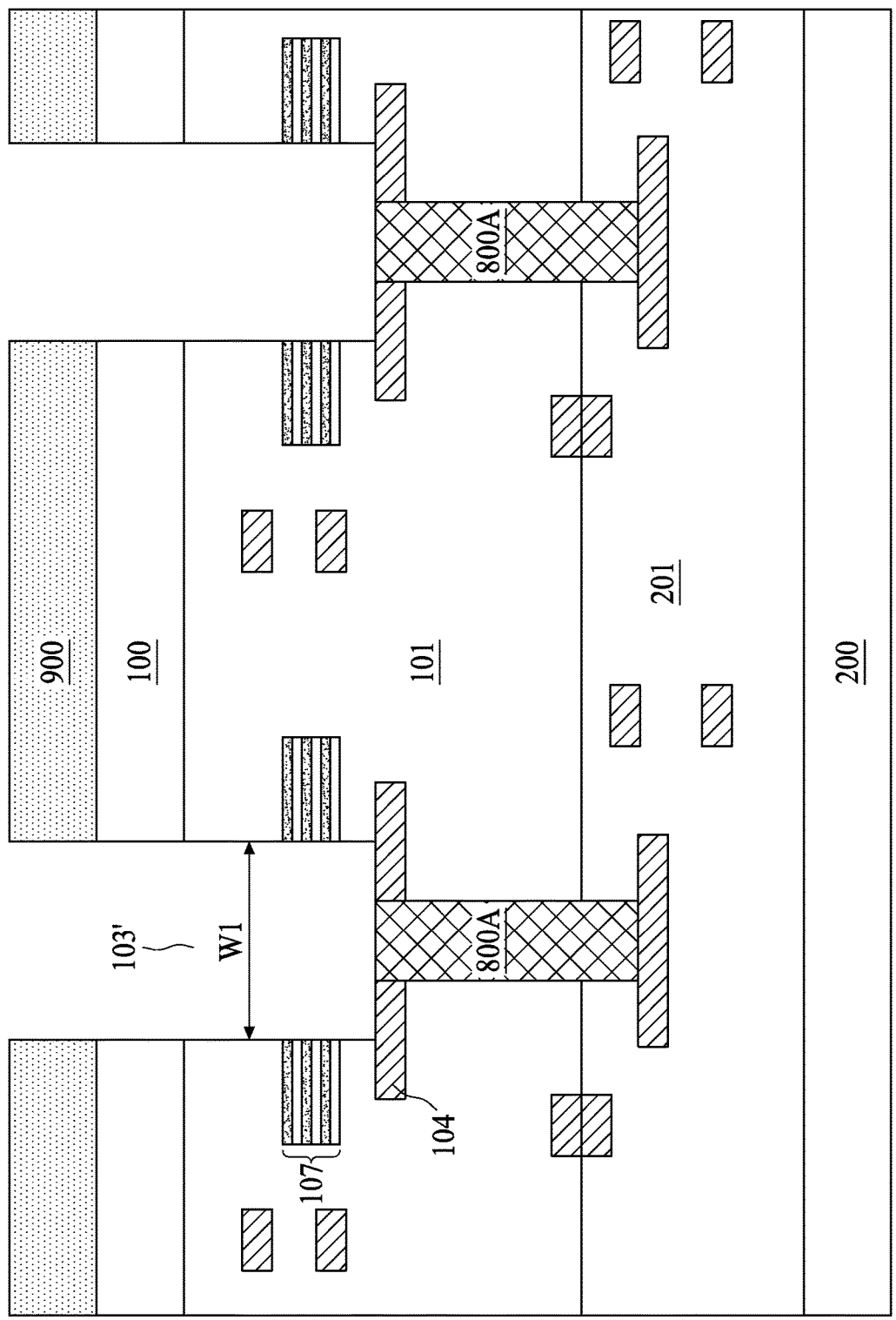

Referring to FIG. 21 and FIG. 22, a second mask 900 is patterned over the first substrate 100. An opening 900' of the second mask 900 has a width W1 substantially identical to the width W1 of the first interconnect 103 as shown in FIG. 3. However, in other embodiments, the width of the opening 900' of the second mask 900 can be greater or smaller than the width W1 of the first interconnect 103, as long as the width of the opening 900' is greater than the width W2 of the second interconnect 203 as shown in FIG. 3. In FIG. 23, an etching operation is conducted through the opening 900' of the second mask 900, and a portion of the sidewall of the hollow via is removed. Comparing FIG. 22 and FIG. 23, a first trench 103' having a width W1 is formed in the first dielectric layer 101 by removing the sidewall of an upper portion of the hollow via 203'. The duration of the etching operation in FIG. 23 is substantially shorter than the duration of the operation in FIG. 18, where a deeper hollow via 203' is formed, and thus the sidewall feature at an interface between the portion 107 of the first dielectric layer 101 and the first trench 103' as in FIG. 23 is more uniform than the sidewall feature at an interface between the portion 107 of the first dielectric layer 101 and the first trench 103' as in FIG. 18. In some embodiments, the plug 800A is resistant to the etchant used for removing the first dielectric layer 101.

Figure 24:
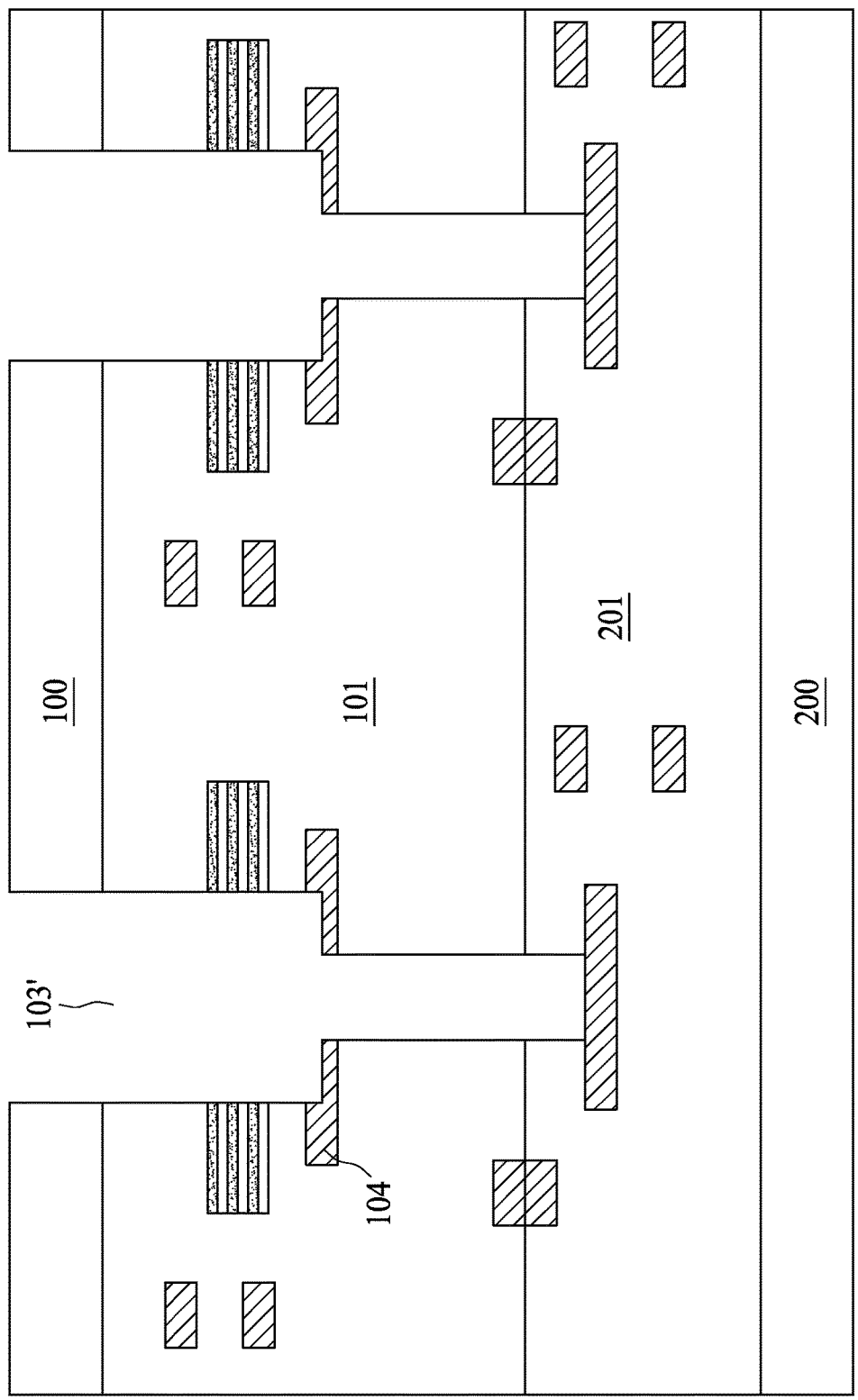
Figure 25:
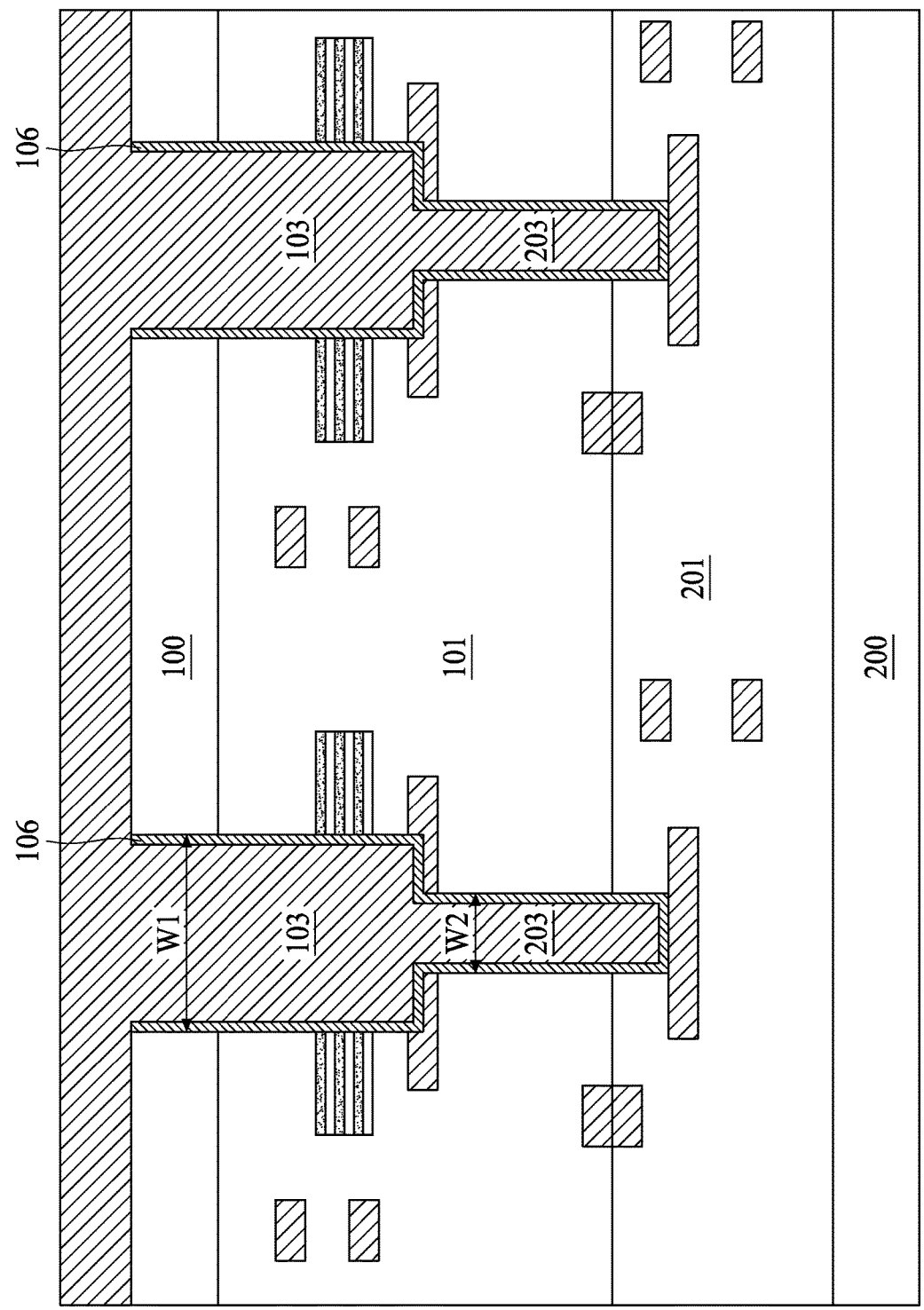

Referring to FIG. 24, the plug 800A at the bottom portion of the hollow via 203' is removed. In some embodiments, the removal of the plug 800A may partially remove the metal pad 104 in the first dielectric layer 101. In FIG. 25, a barrier seed layer 106 is deposited as a lining layer in the first trench 103' and the hollow via 203'. In some embodiments, prior to depositing the conductive materials over the first substrate 100 to fill the first trench 103' and the hollow via 203', a barrier seed layer may be blanket formed by chemical vapor deposition (CVD), plasma vapor deposition (PVD), or atomic vapor deposition (ALD). The materials of the seed layer include copper or copper alloys, and metals such as silver, gold, aluminum, and combinations thereof may also be included. The seed layer may also include aluminum or aluminum alloys. In an exemplary embodiment, the barrier seed layer 106 is formed by an anneal process in which heat is applied to the first substrate 100 to a temperature greater than about 200 degrees Celsius such that the barrier seed layer 106 is self-forming. In one embodiment, the self-formed barrier layer 106 has a thickness from about 1 Angstrom to about 300 Angstroms. In another embodiment, the seed layer is formed by sputtering. In other embodiments, other commonly used methods such as physical vapor deposition or electroless plating may be used.

Following the formation of the barrier seed layer 106, conductive materials are deposited to fill the first trench 103' and the hollow via 203', such that the first interconnect 103 and the second interconnect 203 are formed. In some embodiments, conductive materials may be copper. Deposition of the copper may be by physical vapor deposition (PVD) methods such as sputtering or vacuum evaporation, or by CVD (chemical vapor deposition), electroless plating, or by electro-chemical plating (ECP). The copper layer could include substantially pure elemental copper, copper containing unavoidable impurities, and copper alloys containing minor amounts of elements such as tantalum, indium, tin, zinc, manganese, chromium, titanium, germanium, strontium, platinum, magnesium, niobium, aluminum or zirconium. In alternative embodiments, the deposition may be by ECD (electrochemical deposition). The ECD method involves placing the wafer into an electrolyte bath and electroplating a metal layer onto the wafer surface by applying an electric field between the wafer and the electrolyte. The ECD method is desirable for the deposition of copper because of its superior gap-filling and step coverage. Following ECD deposition (or other deposition technique) the conductive materials are planarized by a CMP operation to expose the first substrate 100, and a passivation layer (not shown) may be formed over the surface where the first substrate 100 and the conductive materials are coplanar. Thereafter, conventional processing methods may complete the stacked chip fabrication.

Some embodiments of the present disclosure provide a semiconductor structure. The structure includes a first substrate; a first dielectric layer having a first surface in proximity to the first substrate and a second surface away from the first substrate; a first interconnect penetrating the first surface of the first dielectric layer; and a protection layer extending along a portion of a sidewall of the first interconnect. A thickness of the protection layer is in a range of from about 0.02 µm to about 0.2 µm.

In some embodiments of the present disclosure, the first dielectric layer includes an alternating dielectric stack with at least two dielectric materials having different resistance to an etchant capable of removing the first dielectric layer.

In some embodiments of the present disclosure, the semiconductor structure further includes a second substrate; a second dielectric layer having a third surface in proximity to the second substrate and a fourth surface away from the second substrate, the fourth surface being connecting to the second surface; and a second interconnect penetrating the fourth surface.

In some embodiments of the present disclosure, the protection layer at a portion of a sidewall of the first interconnect has an aspect ratio more than 5.

In some embodiments of the present disclosure, the protection layer at a portion of a sidewall of the first interconnect has a height of from about 0.5 µm to about 1.5 µm.

In some embodiments of the present disclosure, a material of the protection layer includes oxides.

In some embodiments of the present disclosure, a width of a cross section of the first interconnect is greater than or equal to a width of a cross section of the second interconnect, the cross section including a line interface between the first dielectric layer and the second dielectric layer.

In some embodiments of the present disclosure, the alternating dielectric stack includes silicon carbide and black diamond.

In some embodiments of the present disclosure, the first interconnect is horizontal and the second interconnect is vertical.

Some embodiments of the present disclosure provide a method for manufacturing a semiconductor structure. The method includes forming a first trench in a first dielectric layer having one surface in proximity to a first substrate; forming a sidewall protection layer having a thickness in a range of from about 0.02 µm to about 0.2 µm in the first dielectric layer; and forming a second trench through an opening of the first trench, the second trench being partially in a second dielectric layer, and the second trench penetrating an interface between the first dielectric layer and the second dielectric layer.

In some embodiments of the present disclosure, the forming the sidewall protection layer in the first dielectric layer of the method includes filling oxide materials in the first trench; and removing a center portion of the oxide materials so that a sidewall of the first trench is covered with the oxide materials.

In some embodiments of the present disclosure, the method further including filling conductive materials in the first trench and the second trench.

In some embodiments of the present disclosure, the forming the first trench in the first dielectric layer of the method includes removing an alternating dielectric stack with at least two dielectric materials having different resistance to an etchant capable of removing the first dielectric layer.

In some embodiments of the present disclosure, the forming a sidewall protection layer in the first dielectric layer is prior to the forming of the first trench in the first dielectric layer.

In some embodiments of the present disclosure, the forming the sidewall protection layer includes: forming a hollow channel with an aspect ratio more than 5 in a first portion of the first dielectric layer; and filling oxide materials in the hollow channel. The first portion of the first dielectric layer is in proximity to the first substrate.

In some embodiments of the present disclosure, the method further includes forming a second portion of the first dielectric layer, the second portion being positioned between the first portion of the first dielectric layer and the second dielectric layer.

Some embodiments of the present disclosure provide a method for manufacturing a semiconductor structure. The method includes forming a hollow via penetrating a first dielectric layer and a second dielectric layer; and removing a portion of a sidewall of the hollow via at the first dielectric layer. The first dielectric layer includes an alternating dielectric stack with at least two dielectric materials having different resistance to an etchant capable of removing the first dielectric layer.

In some embodiments of the present disclosure, the removing the portion of the sidewall of the hollow via at the first dielectric layer includes: forming a plug in a bottom portion of the hollow via; and patterning a mask with an opening greater than a cross-sectional width of the hollow via.

In some embodiments of the present disclosure, the forming the plug in the bottom portion of the hollow via includes a plasma etch back operation.

In some embodiments of the present disclosure, the method further includes removing the plug in the bottom portion of the hollow via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a hollow via penetrating a first dielectric layer and a second dielectric layer; and
   removing a portion of a sidewall of the hollow via at the first dielectric layer,
   wherein the first dielectric layer comprises an alternating dielectric stack with at least two dielectric materials having different resistance to an etchant capable of removing the first dielectric layer.

2. The method of claim 1, wherein the removing the portion of the sidewall of the hollow via at the first dielectric layer comprises:
   forming a plug in a bottom portion of the hollow via; and
   patterning a mask with an opening greater than a cross-sectional width of the hollow via.

3. The method of claim 2, wherein the forming the plug in the bottom portion of the hollow via comprises a plasma etch back operation.

4. The method of claim 2, further comprising removing the plug in the bottom portion of the hollow via.

5. The method of claim 1, wherein a first surface of the first dielectric layer is connected to a first substrate.

6. The method of claim 5, wherein the forming the hollow via penetrating the first dielectric layer and the second dielectric layer comprises:
   patterning the first substrate;
   forming a mask over the first substrate and the first dielectric layer; and
   removing the first dielectric layer through the mask.

7. The method of claim 2, wherein forming the plug in the bottom portion of the hollow via comprises filling curable materials into the hollow via.

8. The method of claim 7, wherein the curable materials comprises photoresist or dielectric materials.

9. A method for manufacturing a semiconductor structure, comprising:
  forming a first trench through a first mask and a second trench through a second mask in a dielectric layer, comprising:
    forming a hollow via penetrating an upper portion of the dielectric layer and a lower portion of the dielectric layer through the first mask; and
    removing a portion of a sidewall of the hollow via at the upper portion of the dielectric layer through the second mask, an upper portion of the dielectric layer being in proximity to a substrate above the dielectric layer,
  wherein one of the first trench and the second trench penetrates through an alternating dielectric stack with at least two dielectric materials having different resistance to an etchant capable of removing the dielectric layer, and the first trench and the second trench are connected along a direction perpendicular to a top surface of the dielectric layer, and an opening of the first mask and an opening of the second mask are different.

10. The method of claim 9, wherein the removing the portion of the sidewall of the hollow via at the upper portion of the dielectric layer comprises:
  forming a plug in a bottom portion of the hollow via; and
  patterning the second mask with an opening greater than a cross-sectional width of the hollow via.

11. The method of claim 10, wherein the forming the plug in the bottom portion of the hollow via comprises:
  filling curable materials into the hollow via;
  etching back the curable materials at an upper portion of the hollow via; and
  curing the curable materials at the bottom portion of the hollow via.

12. The method of claim 11, wherein the etching back the curable materials comprises:
  performing a development operation; and
  performing a plasma etch operation.

13. The method of claim 9, wherein the opening of the first mask is smaller than the opening of the second mask.

14. The method of claim 10, further comprising removing the plug in the bottom portion of the hollow via.

15. The method of claim 9, wherein a duration of removing the portion of the sidewall of the hollow via is shorter than a duration of forming the hollow via.

16. The method of claim 9, further comprising forming a barrier seed layer lining the first trench and the second trench.

17. The method of claim 9, further comprising filling the first trench and the second trench with conductive materials after removing the plug in the bottom portion of the hollow via.

18. A method for manufacturing a semiconductor structure, comprising:
  bonding a first dielectric of a first substrate with a second dielectric of a second substrate, the first dielectric is in contact with a front surface of the first substrate;
  forming a hollow via penetrating the first dielectric and the second dielectric through a first mask; and
  removing a portion of a sidewall of the hollow via in the first dielectric layer through a second mask.

19. The method of claim 18, wherein an opening of the first mask is smaller than an opening of the second mask.

20. The method of claim 18, further comprising:
  filling curable materials into the hollow via;
  etching back the curable materials at an upper portion of the hollow via; and
  curing the curable materials at the bottom portion of the hollow via to form a plug.

* * * * *